United States Patent
Furuyama

(10) Patent No.: US 10,490,387 B2
(45) Date of Patent: Nov. 26, 2019

(54) CHARGED PARTICLE BEAM DEFLECTION DEVICE

(71) Applicant: Kabushiki Kaisha Toshiba, Tokyo (JP)

(72) Inventor: Hideto Furuyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/106,845

(22) Filed: Aug. 21, 2018

(65) Prior Publication Data
US 2019/0295809 A1    Sep. 26, 2019

(30) Foreign Application Priority Data

Mar. 20, 2018  (JP) .................. 2018-053506

(51) Int. Cl.
| | |
|---|---|
| *H01J 37/24* | (2006.01) |
| *H01J 37/14* | (2006.01) |
| *H01J 37/147* | (2006.01) |
| *H01J 37/317* | (2006.01) |

(52) U.S. Cl.
CPC ............ *H01J 37/147* (2013.01); *H01J 37/24* (2013.01); *H01J 37/3174* (2013.01); *H01J 2237/151* (2013.01)

(58) Field of Classification Search
CPC .............. H01J 37/045; H01J 37/3174; H01J 2237/0435; H01J 37/22; H01J 2237/2482; H01J 2237/0453; H01J 2237/31774; G02B 6/13; G02B 6/42
USPC ....... 250/396 R, 492.22, 492.23, 216, 492.2, 250/492.1; 385/14, 31, 80; 430/296
See application file for complete search history.

(56) References Cited

U.S. PATENT DOCUMENTS

| | | | |
|---|---|---|---|
| 5,260,579 A | 11/1993 | Yasuda et al. | |
| 6,188,074 B1 | 2/2001 | Satoh et al. | |
| 8,729,507 B2 | 5/2014 | Yoshikawa et al. | |
| 8,841,636 B2* | 9/2014 | Wieland ................ | B82Y 10/00 250/396 R |
| 8,965,149 B2* | 2/2015 | Uemura ................... | G02B 6/12 385/14 |
| 9,036,962 B2* | 5/2015 | De Boer ................. | B82Y 10/00 385/31 |

(Continued)

FOREIGN PATENT DOCUMENTS

| | | | |
|---|---|---|---|
| JP | H3-89327 A | 4/1991 | |
| JP | H5-166707 A | 7/1993 | |

(Continued)

*Primary Examiner* — David A Vanore
(74) *Attorney, Agent, or Firm* — Finnegan, Henderson, Farabow, Garrett & Dunner, L.L.P.

(57) ABSTRACT

According to one embodiment, a charged particle beam deflection device includes a substrate, a plurality of charged particle beam transmission apertures provided in the substrate, a plurality of electrode pairs deflecting charged particle beams passing through the charged particle beam transmission apertures, a light receiving element controlling a voltage applied to one electrode of the electrode pair, and an optical waveguide providing an optical signal to the light receiving element. A distance between the charged particle beam transmission aperture and the light receiving element is shorter than a distance between mutually-adjacent charged particle beam transmission apertures.

21 Claims, 17 Drawing Sheets

(56) References Cited

U.S. PATENT DOCUMENTS

| | | | |
|---|---|---|---|
| 10,103,514 B2* | 10/2018 | Ohira | H01S 5/18361 |
| 2005/0062950 A1 | 3/2005 | van 't Spijker et al. | |
| 2009/0140160 A1 | 6/2009 | Platzgummer et al. | |
| 2012/0145931 A1* | 6/2012 | Van Melle | B82Y 10/00 250/559.01 |
| 2014/0057212 A1* | 2/2014 | Ohishi | H01J 37/3007 430/325 |
| 2014/0106279 A1* | 4/2014 | Morita | H01J 37/045 430/296 |
| 2015/0102231 A1 | 4/2015 | Matsumoto | |
| 2015/0129773 A1 | 5/2015 | Matsumoto | |
| 2015/0348741 A1* | 12/2015 | Matsumoto | H01J 37/3177 250/400 |
| 2016/0064178 A1* | 3/2016 | Matsumoto | H01J 37/045 250/396 R |
| 2016/0064179 A1 | 3/2016 | Yamashita et al. | |
| 2016/0099129 A1 | 4/2016 | Yamashita et al. | |
| 2016/0111246 A1* | 4/2016 | Matsumoto | H01J 37/045 250/396 R |
| 2016/0141142 A1 | 5/2016 | Matsumoto | |

FOREIGN PATENT DOCUMENTS

| | | |
|---|---|---|
| JP | H7-85497 A | 3/1995 |
| JP | H11-176719 A | 7/1999 |
| JP | 2009-502033 A | 1/2009 |
| JP | 4664293 B2 | 4/2011 |
| JP | 2014-7379 A | 1/2014 |
| JP | 2015-76596 A | 4/2015 |
| JP | 2015-95539 A | 5/2015 |
| JP | 2015-228471 A | 12/2015 |
| JP | 2016-54285 A | 4/2016 |
| JP | 2016-54291 A | 4/2016 |
| JP | 2016-76548 A | 5/2016 |
| JP | 2016-82106 A | 5/2016 |
| JP | 2016-96270 A | 5/2016 |

* cited by examiner

CHARGED PARTICLE BEAM DEFLECTION DEVICE

CROSS-REFERENCE TO RELATED APPLICATION

This application is based upon and claims the benefit of priority from Japanese Patent Application No. 2018-053506, filed on Mar. 20, 2018; the entire contents of which are incorporated herein by reference.

FIELD

Embodiments described herein relate generally to a charged particle beam deflection device.

BACKGROUND

Lithography devices and patterning devices that use a charged particle beam such as an electron beam, an ion beam, etc., are used in industry; and lithography devices and the like that use multiple beams of charged particles for higher throughput are being developed in addition to devices that use a single beam of charged particles.

DETAILED DESCRIPTION

Figure 1:
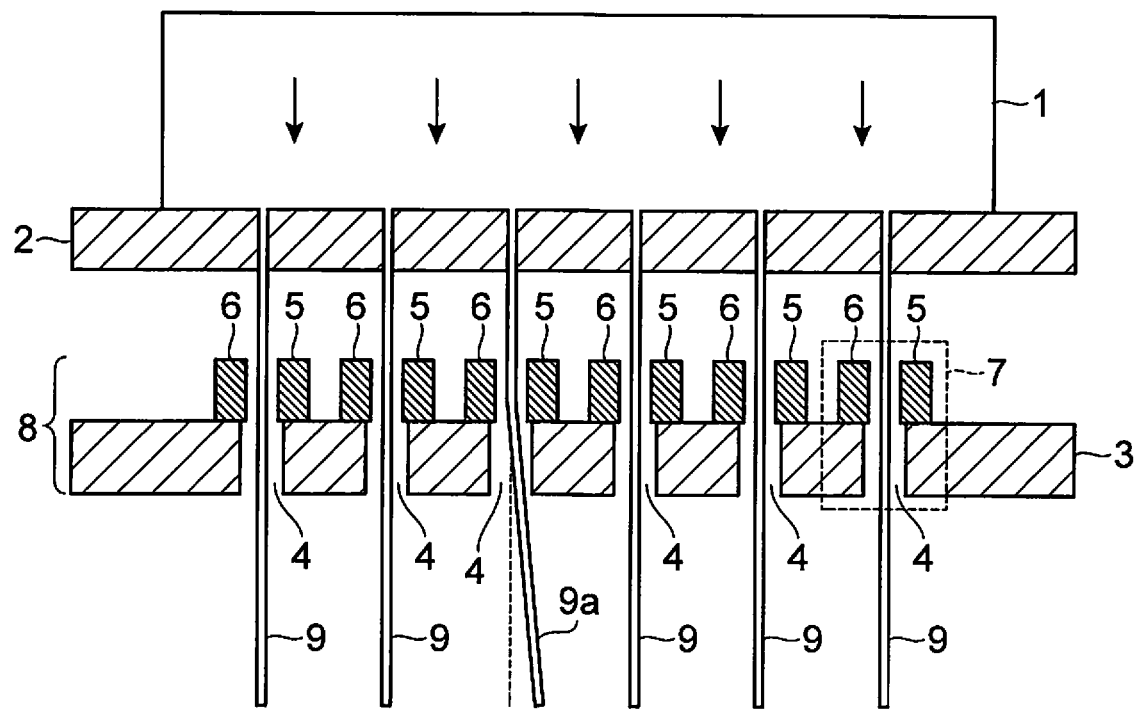
FIG. 1 is a schematic cross-sectional view of a charged particle beam deflection device of a first embodiment.

Although increasing the number of charged particle beams and reducing the beam pitch are needed for higher throughput of a multi-electron beam lithography device or the like, congestion of the charged particle beam control signal interconnect of the charged particle beam deflection device becomes pronounced; and the throughput improvement is unfortunately suppressed by degradation of the signal quality due to interconnect crosstalk, signal attenuation, etc.

The embodiments of the invention are directed to provide a charged particle beam deflection device that can accommodate the higher density of the control signal interconnect due to increasing of the number of beams and reducing the beam pitch.

According to one embodiment, a charged particle beam deflection device includes a substrate, a plurality of charged particle beam transmission apertures provided in the substrate, a plurality of electrode pairs deflecting charged particle beams passing through the charged particle beam transmission apertures, a light receiving element controlling a voltage applied to one electrode of the electrode pair, and an optical waveguide providing an optical signal to the light receiving element. A distance between the charged particle beam transmission aperture and the light receiving element is shorter than a distance between mutually-adjacent charged particle beam transmission apertures.

Embodiments will now be described with reference to the drawings as appropriate. For convenience of description, the scale in each drawing is not always accurate; and relative positional relationships, etc., may be used. The same or similar components are marked with the same reference numerals.

Although a deflection device of an electron beam mainly is described in the embodiment, it goes without saying that the description can be performed similarly for a deflection device of another charged particle beam such as an ion beam, etc.

Charged particle beam devices such as an electron beam lithography device, an ion beam milling device, etc., are utilized widely in fine patterning, analysis and evaluation, etc.; and in particular, the electron beam lithography device is an important infrastructure device that supports the huge semiconductor industry and is indispensable for mask manufacturing for the mass production of semiconductor devices. Advances continue in recent years to realize further downscaling or effective downscaling of semiconductor technology; and the need for downscaling and throughput improvement of electron beam mask lithography devices is steadily increasing.

On the other hand, the downscaling of electron beam lithography is accompanied by the growth of drawing data; and the throughput decrease of mask manufacturing is becoming worse. Therefore, higher drawing speeds are necessary for higher throughput of the electron beam mask lithography device; and multibeam usage of the electron beam is being developed to drastically improve the drawing speed which is easily limited by the resist exposure time. Because the pattern lithography is performed simultaneously by multiple electron beams in a multi-electron beam lithography device, a drastic throughput improvement is possible compared to single-electron beam lithography.

To perform multi-electron beam lithography, it is necessary to split the electron beam and perform individual blanking (ON/OFF) control of the split electron beams; and a blanker array that corresponds to the split electron beams is necessary. Although a shutter may be considered as the blanker of the multi-electron beam lithography device, accelerated electrons of 10 to 50 keV are used in the electron beam lithography device; and a shutter is unfavorable from the perspective of durability and operation speed. Therefore, as the blanker of the multi-electron beam lithography device, a method is employed in which a beam deflector is used; and substantial beam blanking is performed away from the imaging plane by electron beam deflection.

An actual multi-electron beam lithography device draws without gaps by arranging the split electron beams at uniform spacing and by performing simultaneous drawing while collectively moving all of the beams between the beam pitch. Therefore, it is necessary to maintain the high-precision two-dimensional arrangement of the split electron beams and the blanker array; and the split beam generation and the individual beam control are performed by using a two-dimensionally arranged opening (aperture) array formed in one substrate each for the split electron beams and for the blanker array. Hereinbelow, the former is called a SAA (Shaping Aperture Array) substrate (or simply SAA); and the latter is called a BAA (Blanking Aperture Array) substrate (or simply BAA).

Although reducing the beam size and the beam pitch of the electron beam, increasing the number of beams, etc., are needed to realize further downscaling and higher throughput for the multi-electron beam lithography device, such improvements cause pronounced congestion of the interconnect that transmits the blanking control signals of the electron beam deflection device (BAA) to the blankers, which undesirably causes the problem of the device throughput decreasing due to the transmission quality decrease of the blanking control signals such as crosstalk and/or skew between the blanking control signals, signal attenuation and/or waveform distortion due to the interconnect downscaling, etc. Also, electromagnetic disturbance due to the blanking control signal interconnect is superimposed easily on the electron beam passing through the BAA substrate due to the congestion of the blanking control signal interconnect, which easily causes the problem of a decrease of the pattern lithography quality itself which is due to the electron beam.

In the embodiment, to be able to accommodate the higher density of the charged particle beam deflection device control signal interconnect due to increasing of the number of beams and/or reducing the beam pitch, the blanking control signal interconnect in the blanker array region of the BAA substrate is realized using optical interconnect using an optical waveguide; and the interference between the blanking control signals and the electromagnetic disturbance superimposed onto the electron beam are suppressed by intrinsically eliminating the electromagnetic interference and/or the electromagnetic radiation of the interconnect passing through the blanker vicinity.

Although magnetic field deflection and electric field deflection may be used as the method for deflecting the charged particle beam, here, it is presupposed that the optical interconnect is used to eliminate the congestion of the blanking control signal interconnect; and electric field deflection which has voltage control is used instead of magnetic field deflection which has current control. This is because the optoelectric conversion element (the light receiving element or the photodetector) that performs the signal output of the optical interconnect generally is a current output element, i.e., an element that has a current output proportional to the received light power; a large optical power transmission by the optical interconnect would be necessary to ensure the large current for magnetic field control; and higher electrical power consumption is unavoidable.

On the other hand, in the case where electric field deflection is used, the optoelectric conversion element functions as a current source having a constant output not more than the bias voltage; therefore, the optoelectric conversion element is limited to the bias voltage or less; however, by setting the load resistance to be large, a large output voltage can be obtained even for a small current; and lower electrical power consumption is easy because a small optical transmission power is sufficient.

In other words, it is also possible to control the electric field deflection directly by the optical interconnect; and rather than driving the electric field deflection electrode by reproducing the signal of the optical interconnect as a digital signal, a voltage that is substantially proportional to the optical power of the optical interconnect is directly generated by the photocurrent that is substantially proportional to the optical power of the optical interconnect; and an analog control can be performed for the electric field deflection electrode. Also, the optical transmission power is not determined uniquely for the control voltage of the electric field deflection, and is settable by considering the performance balance as a device by considering the magnitude of the load resistance and the bandwidth reduction of the operation speed due to the load resistance.

In the embodiment, it is also possible to directly control the ON/OFF control of the blankers by the optical signal without using an electrical amplifier circuit; and not only is the electromagnetic interference at the blanking control signal interconnect portion fundamentally eliminated, but also the configuration uses only the minimum electronic elements (the light receiving element and the load resistance); and it is possible to prevent the misoperation and/or the degradation of the electronic circuit (particularly, the transistors, etc.) due to scattered electrons from the electron beam and/or fluorescent X-rays emitted by the electron beam shaping member.

In the case where current control is performed using optical interconnect and a voltage-current conversion element such as a FET (Field effect transistor), etc., it is possible to suppress the power consumption somewhat even for magnetic field deflection; but in order to ensure the channel resistance reduction and the current ON/OFF ratio of the FET element, as a result, a relatively large optical power is necessary to drive the FET element. Also, the misoperation and/or the degradation problem of the FET itself recurs.

Accordingly, due to the substantial practical limits, the embodiments described below are limited to the combination of optical interconnect and electric field deflection. Specific configurations of embodiments will now be described.

First Embodiment

Figure 2:
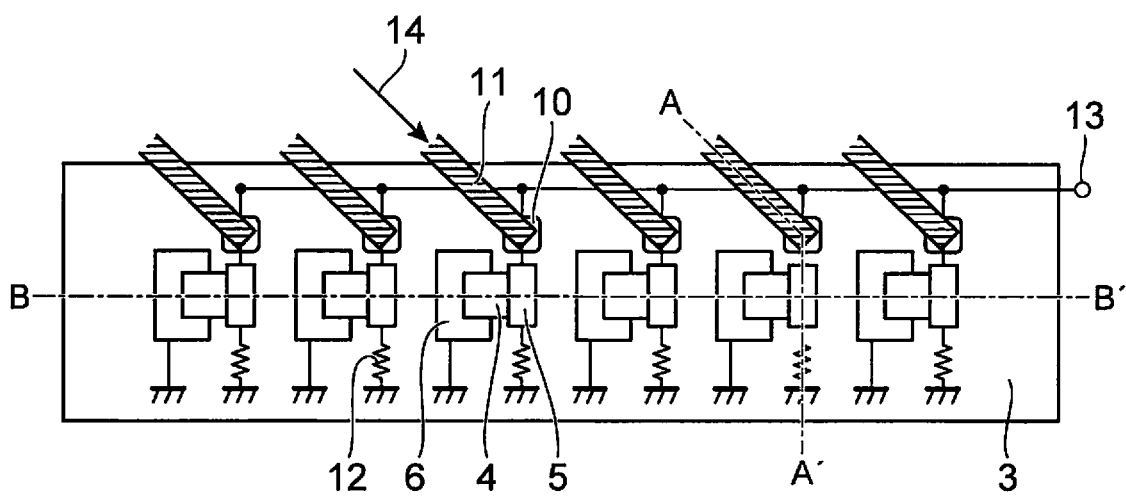
FIG. 2 is a schematic top view of the charged particle beam deflection device of the first embodiment.
Figure 3A:
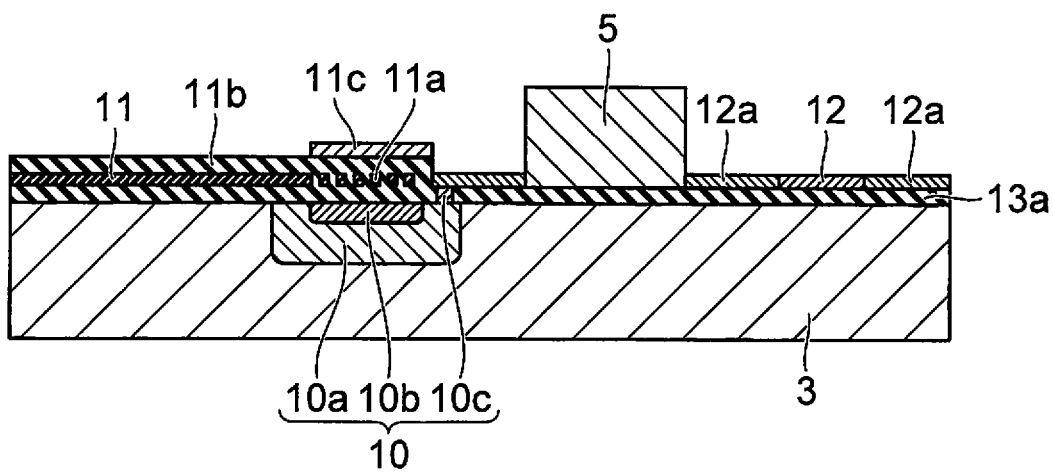
FIG. 3A is a schematic cross-sectional view of one blanker along A-A' of FIG. 2.
Figure 3B:
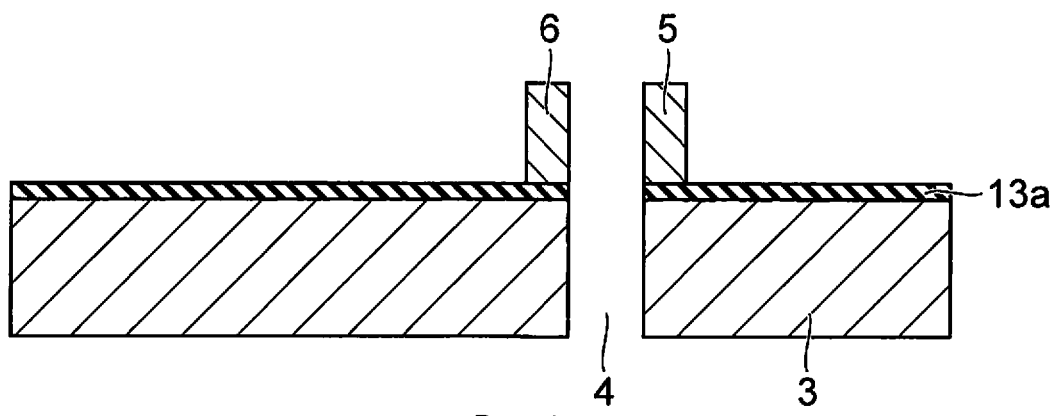
FIG. 3B is a schematic cross-sectional view of one blanker along B-B' of FIG. 2.

FIG. 1 to FIG. 3B are schematic configuration diagrams showing a first embodiment; FIG. 1 is a schematic cross-sectional view showing the overall configuration of the SAA and the BAA; FIG. 2 is a schematic top view in which a portion of the BAA is extracted; FIG. 3A is a schematic cross-sectional configuration diagram of one blanker 7 along A-A' of FIG. 2; and FIG. 3B is a schematic cross-sectional configuration diagram of one blanker 7 along B-B' of FIG. 2.

FIG. 1 illustrates an input electron beam 1, a beam shaping aperture array (SAA) 2, a substrate, e.g., a Si substrate 3 of the BAA, apertures 4 of the BAA, deflection electrodes 5, counter electrodes (e.g., a ground potential) 6, beam deflectors (blankers) 7, a blanking aperture array (BAA) 8, and multi-electron beams 9.

The input electron beam 1 is extracted from an electron gun (not illustrated) and accelerated. The beam shaping aperture array (SAA) 2 splits the input electron beam 1 into multi-electron beams and aligns the beam shape. One beam deflector (blanker) 7 is made of the aperture 4 of the BAA, the deflection electrode 5, and the counter electrode 6.

The input electron beam 1 is converted into the multi-electron beams 9 reflecting the opening configuration and arrangement of the SAA 2; and the input electron beam 1 other than the multi-electron beams 9 is blocked by the SAA 2. The multi-electron beams 9 travel straight as-is while maintaining the prescribed beam array, are controlled by a allover deflection electrode (not illustrated) and an electron beam lens (not illustrated), and are reduced to, for example, $\frac{1}{100}$ and irradiated on an exposure surface (not illustrated). At this time, the beam pattern that is projected onto the exposure surface is a beam array pattern having undergone beam control by the BAA 8; for example, in the case where a passing electron beam 9a is deflected by applying a voltage of, for example, +5 V to the deflection electrode 5 third from the left in FIG. 1, a pattern in which the electron beam 9a is blanked is projected onto the exposure surface. It is sufficient for the blanked electron beam 9a to be caused to travel toward a direction different from that of the non-deflected beams so that the electron beam 9a cannot pass through a aperture stop provided before the exposure surface (a not-illustrated aperture stop provided at the intermediate convergence point vicinity of the entire beam) and is blocked by the aperture stop member.

A light receiving element 10, an optical waveguide 11, a load resistance 12, power supply interconnect 13, and a control light 14 corresponding to the blanking control signal are illustrated in FIG. 2.

Although the details of the operations of these components are described below, the control light 14 that is transmitted by the optical waveguide 11 is converted into a current by the light receiving element 10 and is converted into a voltage by the load resistance 12, etc.; and the prescribed voltage is applied to the deflection electrode 5. At this time, the electron beam that passes through the aperture 4 is deflected by the electric field determined by the potential difference and the distance between the deflection electrode 5 and the counter electrode 6. On the other hand, when the control light 14 stops, the light receiving element 10 no longer generates the current; the charge that is stored in the parasitic capacitance of the deflection electrode 5 and the light receiving element 10 is electrically discharged via the load resistance 12; and the voltage applied to the deflection electrode 5 decreases. At this time, in the case where one end of the load resistance 12 is grounded, the deflection electrode 5 also is set to the ground potential; the electric field with the counter electrode 6 becomes zero; and the electron beam that passes through the aperture 4 travels straight.

In these operations, the optical signal is converted directly into the drive voltage of the deflection electrode 5 as an analog (continuous) quantity; and the deflection amount of the electron beam due to the deflection electrode 5 can be remotely controlled as an analog quantity from the portion of the optical waveguide 11 emitting the control light 14. In other words, the deflection angles of the electron beams 9 can be controlled remotely and independently for each deflection electrode; for example, it becomes possible to combine operations other than the simple blanking (ON/OFF) operation for each deflection electrode such as performing a micro deflection oscillation (micro-region scanning) small enough not to go outside the aperture stop described above. The micro deflection oscillation recited above is utilizable when drawing a pattern having relatively rough dimensions by equivalently enlarging the beam sizes of the electron beams, etc. Also, because transistors are not included in the circuit, effects also are provided such as the degradation due to scattered electron beams, fluorescent X-rays, etc., does not occur easily; the power consumption is low because the deflection electrode 5 is driven by the substantially minimum electrical power; the array distortion of the electron beam array due to the distortion of the BAA of cause by heat generation does not occur easily, etc.

FIGS. 3A and 3B illustrate p-type Si 10a, n-type Si 10b, a p-electrode 10c, the optical waveguide 11, a diffraction grating 11a where the optical waveguide 11 is patterned into a periodic structure, a cladding layer 11b, a reflective metal 11c, interconnect metal 12a, a $SiO_2$ film 13a that includes an insulating film and a cladding layer, the deflection electrode 5, the counter electrode 6, and the load resistance 12. A so-called pn junction photodiode is constituted by the p type Si 10a and the n type Si 10b, but an i type (low carrier concentration) Si may be provided between the p type Si 10a and the n type Si 10b to form a pin-photodiode. The p-electrode 10c is, for example, W, Ti, Al, etc. The optical waveguide 11 is, for example, SiON. The cladding layer 11b is, for example, $SiO_2$. The reflective metal 11c is, for example, Al, Ni, Pt, Au, Ag, etc. The interconnect metal 12a is, for example, Al, Cu, etc. The deflection electrode 5 and the counter electrode 6 are, for example, Cu, Au, etc. The load resistance 12 is, for example, poly Si, a metal silicide, etc.

The optical waveguide 11 is the so-called optical waveguide core and is made of a material (e.g., SiON, SiN, Si, etc.) having a higher refractive index than the cladding layers 11b and 13a. For example, the diffraction grating 11a is formed to have ½ of the period of a wavelength λ of the light propagating the optical waveguide 11. However, the wavelength λ is the wavelength of the light propagating through the optical waveguide 11 and is a wavelength in which the vacuum wavelength is shortened by the amount of the effective refractive index of the optical waveguide 11. Thereby, the light that propagates in the horizontal direction through the optical waveguide 11 is optically coupled in the perpendicular direction at the diffraction grating 11a portion and is input to the light receiving element 10. At this time, because the light that horizontally propagates through the optical waveguide 11 is coupled not only downward but also upward in FIG. 3A at the diffraction grating 11a portion, the light is reflected by the reflective metal 11c; and only downward radiation (light output) is provided. Thereby, the optical coupling efficiency between the optical waveguide 11 and the light receiving element 10 can be increased.

Here, for example, near-infrared light of 850 nm can be used as the control light 14 in the case where the optical waveguide (the core) 11 is made of SiON and the light receiving element 10 is made of a p-n junction of a Si material as in FIG. 3A. Also, for example, infrared light in the 1300 nm band or the 1550 nm band that is used in optical fiber communication can be used as the control light 14 in the case where the optical waveguide (the core) 11 is made of Si, and the light receiving element 10 is a p-n junction element (not illustrated) or a MSM (Metal Semiconductor Metal) junction element (not illustrated) or the like made of Ge or a compounded semiconductor material (e.g., a GaInAs/InP material, SiGe, etc.) integrated on the Si substrate 3.

Figure 4A:
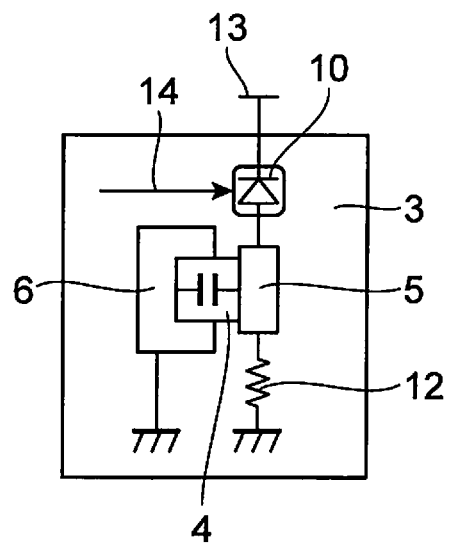
FIG. 4A is a schematic top view in which one blanker portion in FIG. 2 is extracted.

FIG. 4A is a schematic top view in which one blanker portion in FIG. 2 is extracted; and for easier understanding of the circuit connection configuration, the optical waveguide 11 is not illustrated; and a simplified light input/output relationship is shown by the arrow of the control light 14.

Although the light receiving element 10 includes the p-n junctions (10a and 10b) and the anode electrode 10c of FIG. 3A and a cathode electrode (not illustrated) drawn out from the n-type Si 10b, only the polarity and the arrangement of the light receiving element 10 are shown here by a diode symbol.

Figure 4B:
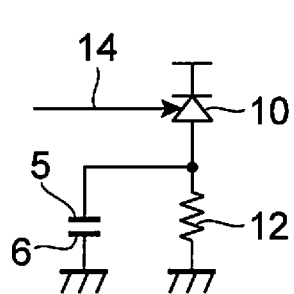
FIGS. 4B and 4C are equivalent circuit diagrams of the charged particle beam deflection device of the first embodiment.

FIG. 4B is an equivalent circuit of FIG. 4A; and the deflection electrode 5 and the counter electrode 6 are shown by a capacitor symbol because the deflection electrode 5 and the counter electrode 6 electrically form a capacitor. Hereinbelow, the deflection electrode 5 and the counter electrode 6 also are labeled collectively using the reference numeral 7.

As shown in FIG. 4A and FIG. 4B, for example, the cathode of the light receiving element 10 is connected to a positive voltage power supply 13 (e.g., +7 V); and the anode of the light receiving element 10 is connected to the load resistance 12 and the deflection electrode 5. In such a case, for example, the counter electrode 6 and the other terminal of the load resistance 12 are connected to the ground potential. When the control light 14 is input in this state, the light receiving element generates a current (a photocurrent) corresponding to the light intensity of the control light 14; and a voltage that is determined by the product with the resistance value of the load resistance 12 is applied to the deflection electrode 5. For example, +5 V is applied to the deflection electrode 5 in the case where the photocurrent of the light receiving element 10 is 10 µA and the resistance value of the load resistance 12 is 500 kΩ.

To drive the deflection electrode 5 by the current of the light receiving element 10, the power supply voltage that is applied by the power supply interconnect 13 is set to be higher than the drive voltage of the deflection electrode 5. Specifically, it is sufficient for the power supply voltage to be set to the sum of the drive voltage of the deflection electrode 5 (e.g., 5 V) and the minimum operating bias voltage of the light receiving element (e.g., 2 V); and in such a case, it is sufficient for the power supply voltage to be set to +7 V.

Also, functions and operations similar to those recited above can be performed by setting the anode of the light receiving element 10 to a negative voltage power supply (e.g., −7 V), connecting the cathode of the light receiving element 10 to the load resistance 12 and the deflection electrode 5, and connecting the counter electrode 6 and the other terminal of the load resistance 12 to the ground potential. In such a case, the electron beam deflection is performed by switching the deflection electrode 5 between the ground potential and −5 V; while for the connection of FIG. 4B, the electron beam deflection is performed by switching the deflection electrode 5 between the ground potential and +5 V. The difference between the two is only that the deflection direction (the angle) of the electron beam is reversed; and the blanking operation is unchanged.

Although one end of the counter electrode 6 and one end of the load resistance 12 are connected to the ground potential described above, a designated reference potential may be used instead of the ground potential. For example, the ground potential in FIG. 4B is replaced with a reference potential (e.g., 1 V); and the power supply voltage is set +8 V. Although the electron beam that passes through the aperture 4 is deflected by the electric field due to the potential difference between the deflection electrode 5 and the counter electrode 6, in this case, there is no potential difference between the two in the non-optical input state; and the reference potential is extremely small compared to the acceleration voltage of the electrons; therefore, the electron beam travels straight in the non-optical input state; and in the optical input state, the electron beam deflection is performed according to the potential difference between the deflection electrode 5 and the counter electrode 6. The reference potential may be used instead of the ground potential for charge-up control of the BAA 8, for a normally-off operation of blanker 7, etc.

Thus, according to the embodiment, it is possible to directly control the voltage of the deflection electrode 5 with light; and a charged particle beam deflection device can be configured without providing electronic circuits including transistors at the blankers. Therefore, not only can the electromagnetic disturbance superimposed onto the electron beam and/or the signal interference due to the electromagnetic interference and/or the electromagnetic radiation of the blanking control signal interconnect of the BAA substrate 8 be suppressed, but also the device stopping due to the misoperation and/or the degradation of the electronic circuit (particularly, the transistor) due to the scattered electrons from the electron beam and/or the fluorescent X-rays emitted by the electron beam limiting member can be eliminated; and the system reliability of the electron beam lithography device can be improved drastically.

On the other hand, as described above, the congestion of the blanking control signal interconnect easily becomes a problem in the performance improvement (the downscaling and the throughput improvement) as a multi-electron beam lithography device; and in the case where the main problem to be solved is interconnect congestion, a drive circuit may be provided at each of the blanker; and the interconnect may be converted to optics.

Figure 4C:
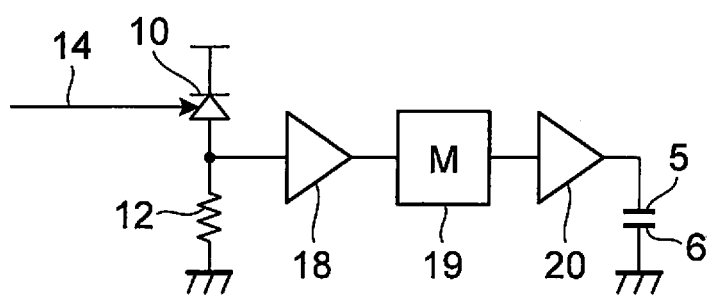

FIG. 4C shows a configuration in which the voltage of the deflection electrode 5 is controlled not by directly generating the drive voltage of the deflection electrode 5 from the blanking control signal light but by converting the optical signal into a digital voltage signal and by using a drive circuit.

An op-amp 18, a memory circuit 19, and a deflection electrode driver 20 are illustrated in FIG. 4C. The control light 14 undergoes voltage conversion by the light receiving element 10 and the load resistance 12; the op-amp 18 is used as a buffer circuit; and a digital signal is stored in the memory circuit 19. Instead of the load resistance 12, a transimpedance amplifier may be used in which a feedback resistor (a conversion resistor) is provided in parallel with the op-amp 18.

In FIG. 4C, the digital data that is stored in the memory circuit 19 is transferred to the deflection electrode driver 20 synchronously the electron beam lithography start signal (not illustrated) of the device; and a timer circuit (not illustrated) that is built into the driver 20 performs the drawing by the electron beam by controlling the deflection electrode driving time according to the data. In such a case, it is unnecessary to directly generate the drive voltage of the deflection electrode 5 from the control light 14; therefore, for example, the load resistance 12 can be set to be relatively small, i.e., 1 kΩ. Thereby, for example, operating band of the light receiving circuit can be 50 times wider than that of FIG. 4B; and high-speed transmission of the control light is possible. Accordingly, while performing the electron beam lithography, for example, it is possible to transmit the next drawing data, store the next drawing data in the memory circuit 19, and standby.

For example, this shows that it is also possible to collectively store the data of multiple deflection electrode drivers 20 in the memory circuit 19, transfer the data from the memory circuit 19 to the multiple deflection electrode drivers 20 synchronously with the electron beam lithography start signal, and perform the parallel control of multiple blankers using one memory circuit. In other words, because the data transmission bandwidth to the memory circuit 19 is large, it is possible to collectively transfer the drawing data of the multiple blankers and control the multiple blankers using one optical waveguide. Accordingly, in the embodiment of FIG. 4C, it is unnecessary to increase the amount of interconnect for the blanking control signal even in the case where the number of multi-electron beams is increased; and the congestion of the blanking control signal interconnect can be eliminated.

In the case where high-speed writing to the memory circuit 19 is performed by electrical interconnect, the electromagnetic radiation of the blanking control signal interconnect is extremely large, and crosstalk between the interconnect and/or electromagnetic noise superimposition on the electron beam undesirably occurs; but here, an optical waveguide is used as the blanking control signal interconnect; therefore, such problems are fundamentally eliminated even when high-speed writing is performed.

Second Embodiment

Figure 5A:
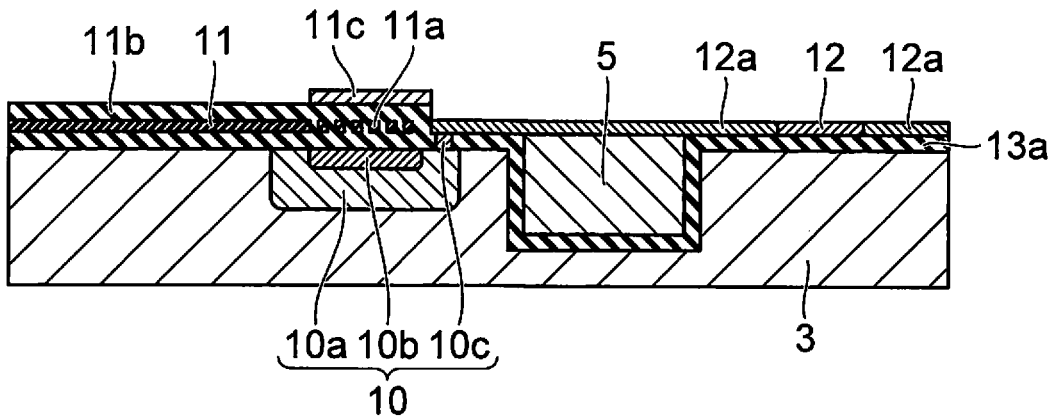
FIGS. 5A and 5B are schematic cross-sectional views of a modification of the embodiment shown in FIGS. 3A and 3B.
Figure 5B:
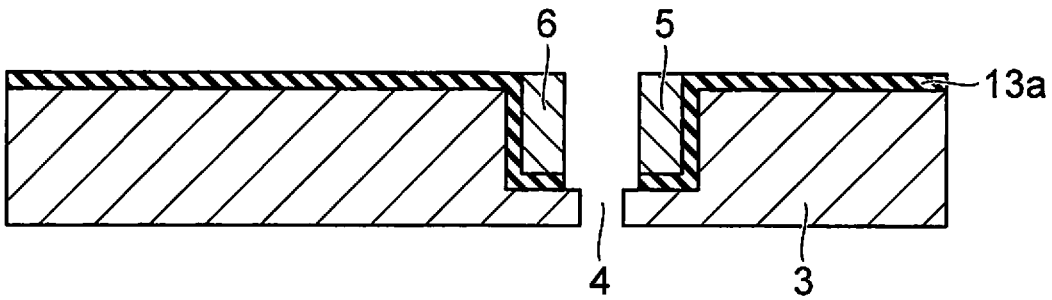

FIGS. 5A and 5B are a modification of the embodiment shown in FIGS. 3A and 3B, and are an example in which the deflection electrode 5 and the counter electrode 6 are formed inside the Si substrate. FIG. 5A is a schematic cross-sectional view corresponding to A-A' of FIG. 2; and FIG. 5B is a schematic cross-sectional view corresponding to B-B' of FIG. 2. By such a configuration, the blanker electrodes do not protrude through the BAA substrate surface; for example, it is easy for the BAA 8 and the SAA 2 to be proximal. Also, it is easy to integrate other devices or provide a protective cover of the light receiving elements and the electronic circuits built into the BAA at the surface of the BAA substrate 8.

FIG. 6A to FIG. 7B are schematic process cross-sectional views showing a manufacturing method of the second embodiment, and show a cross section corresponding to FIG. 5B.

Figure 6A:
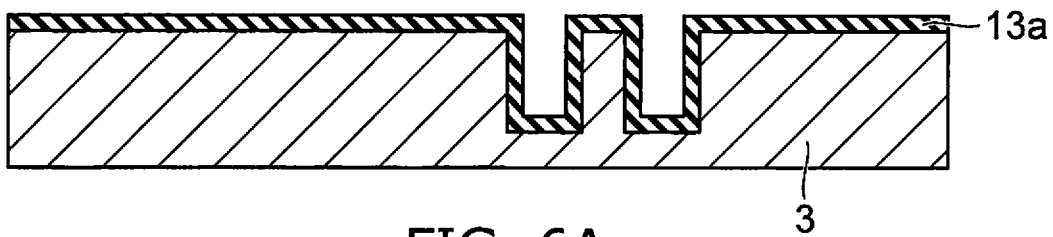
FIG. 6A to FIG. 7B are schematic process cross-sectional views showing a manufacturing method of a charged particle beam deflection device of a second embodiment.

First, after forming the light receiving element 10, electronic circuit element, and the like built into the BAA substrate 8, recesses that correspond to replicas of the deflection electrode 5 and the counter electrode 6 are formed in the blanker electrode formation region of the Si substrate; and the insulating film (e.g., $SiO_2$) 13a is formed over the entire surface including the recess surfaces (FIG. 6A).

Figure 6B:
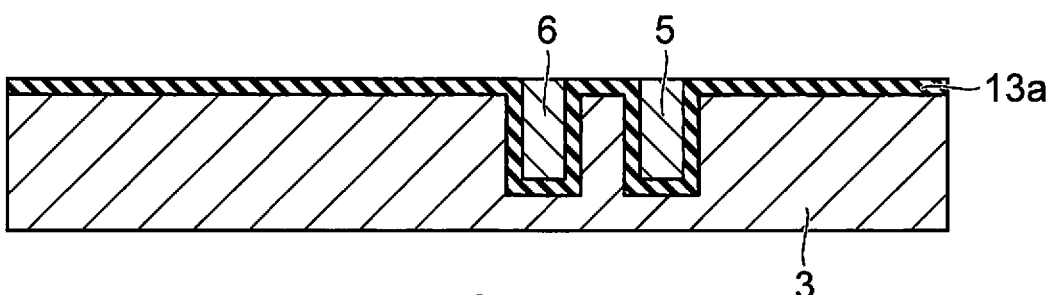

Then, for example, an electrode metal (e.g., Cu, Ni, Au, or the like) is formed by plating in the recesses; and the surface is planarized by polishing, etc. (FIG. 6B).

Figure 7A:
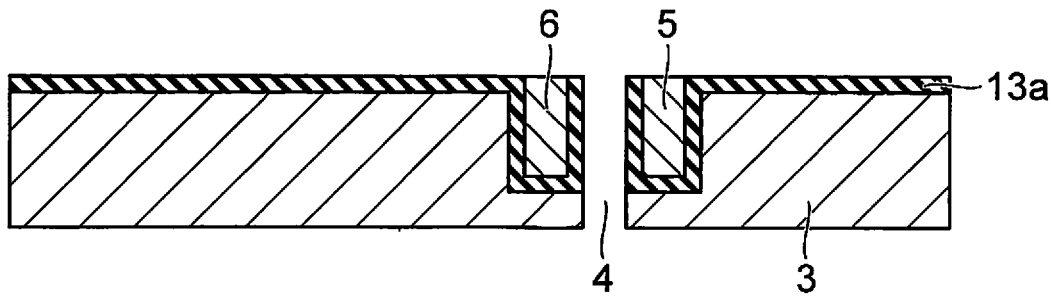

Continuing, the optical waveguide 11 and the diffraction grating 11a are formed; the components of the cladding layer 11b, the electrode 10c, the load resistance 12, the interconnect 12a, the reflective metal 11c, etc., are formed; and the aperture 4 that transmits the electron beam is formed (FIG. 7A).

Figure 7B:
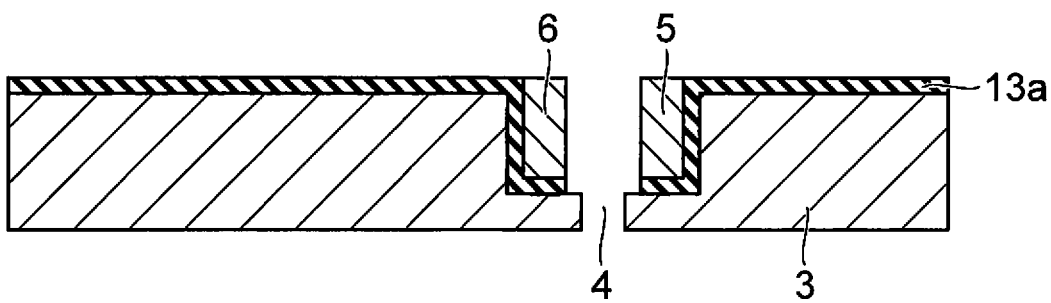

Finally, the configuration of FIG. 5B is realized by removing the insulating film 13a covering the deflection electrode 5 and the counter electrode 6 at the side surface of the aperture 4 (FIG. 7B).

Further, in FIG. 7B, the protruding portion of the Si substrate 3 remains under the opening 4, but it may be removed by over etching in advance or additional etching later.

Third Embodiment

Figure 8:
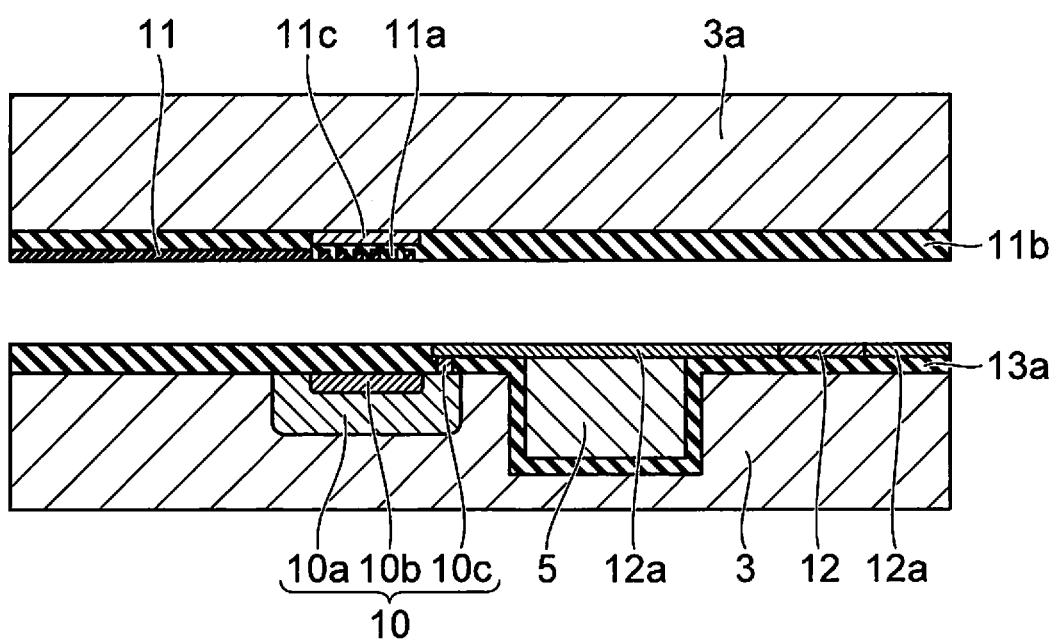
FIG. 8 is a schematic cross-sectional view of a charged particle beam deflection device of a third embodiment.
Figure 9:
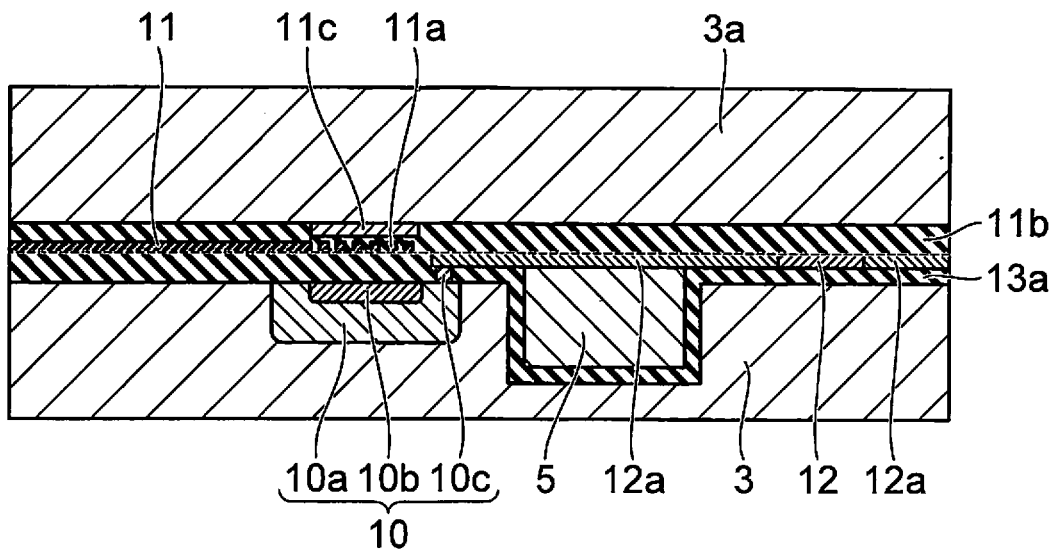
FIG. 9 is a schematic cross-sectional view of the charged particle beam deflection device of the third embodiment.
Figure 10:
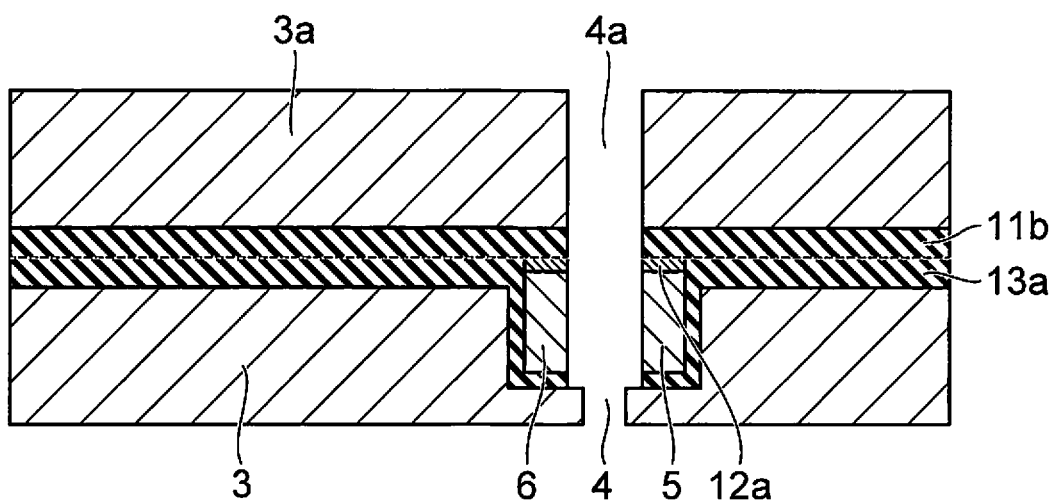
FIG. 10 is a schematic cross-sectional view of the charged particle beam deflection device of the third embodiment.

FIG. 8 to FIG. 10 are schematic configuration cross-sectional views showing a third embodiment, and are an example in which the substrate 3 in which electrical components are integrated and a substrate 3a in which optical components are integrated are bonded to oppose each other. For the description, FIG. 8 shows a state directly before bonding the substrate 3 and the substrate 3a; and FIG. 9 and FIG. 10 are the finished state after bonding the two. FIG. 9 is a schematic cross-sectional view corresponding to A-A' of FIG. 2; and FIG. 10 is a schematic cross-sectional view corresponding to B-B' of FIG. 2.

In the embodiment, by fabricating the electrical components and the optical components which have different fabrication methods and fabrication conditions in separate substrates, an advantage is provided that the fabrication is possible using the optimal conditions. For example, the electrical interconnect 12a and the optical waveguide 11 each are formed using a interconnect rule of about 100 nm to 1 µm; but there is no extreme performance fluctuation even for a interconnect width tolerance of about several % for the electrical interconnect 12a; while the optical waveguide 11 has the feature that the optical transmission characteristics change greatly due to the interconnect width tolerance and the patterned surface roughness. Therefore, even in the case where the electrical interconnect 12a and the optical waveguide 11 are patterned to the same interconnect width, it is necessary to form the optical waveguide 11 with a roughness of 1/10 to 1/100 of that of the electrical interconnect 12a; and it is necessary to apply a patterning method having extremely high precision. Accordingly, separately manufacturing the optical interconnect substrate and the electrical interconnect substrate provides the effects of characteristic optimization and the suppression of excessive costs.

Although the broken lines of FIG. 9 and FIG. 10 show the bonding surface of the substrate 3 and the substrate 3a, the bonding surface actually is formed as one body; and there are many cases where the interface between the $SiO_2$ and the $SiO_2$, etc., cannot be confirmed. The substrate 3 and the substrate 3a are connected optically; and the optical coupling portion (the diffraction grating 11a) of the optical waveguide 11 optically transfers the signal to the light receiving element 10. In such a case, because an electrical connection is unnecessary between the substrate 3 and the substrate 3a, the bonding may be performed after providing thin $SiO_2$ (e.g., 50 nm) on each of the surfaces of the two substrates. Thereby, the bonding of only $SiO_2$ is performed; there is no hybrid bonding interface such as $SiO_2$ and a metal, $SiO_2$ and Si, etc.; and the bonding process is easy.

In the configuration of FIG. 9, there are no electrical components on the substrate 3a side; and the substrate 3a side has only the function of supplying the control light to the substrate 3; however, the actual operations are unchanged from those of FIG. 3A and FIG. 5A. Rather, the substrate 3a functions as a scattered electron cover for the components of the light receiving element 10, the load resistance 12, etc.; therefore, the degradation of the BAA 8 is suppressed; and the running cost reduction effect is high due to the reliability of the device and the enlargement of the maintenance interval.

Fourth Embodiment

Figure 11:
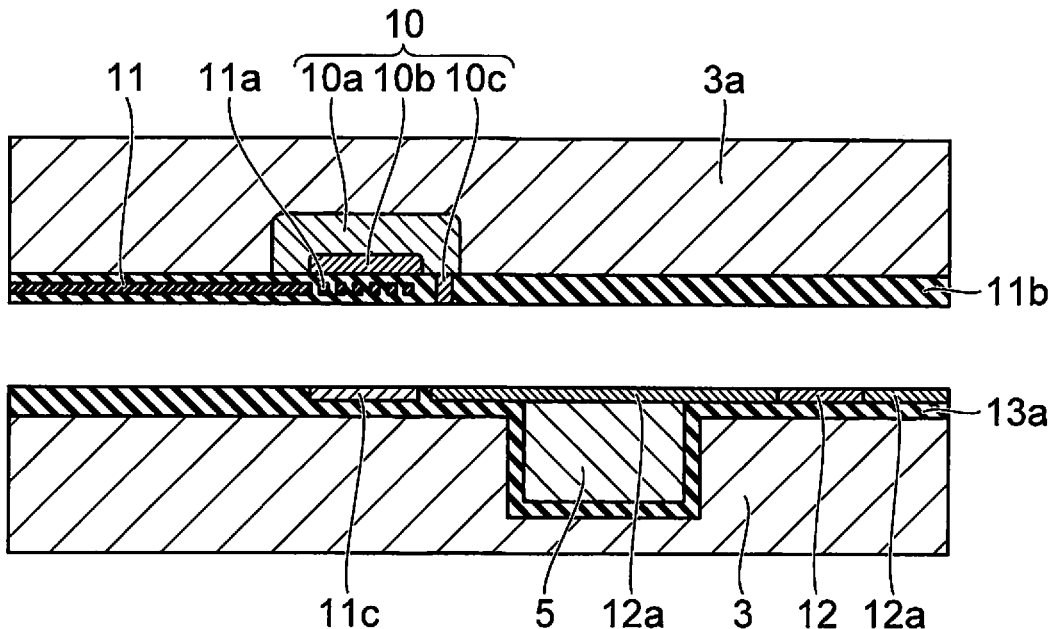
FIG. 11 is a schematic cross-sectional view of a charged particle beam deflection device of a fourth embodiment.
Figure 12:
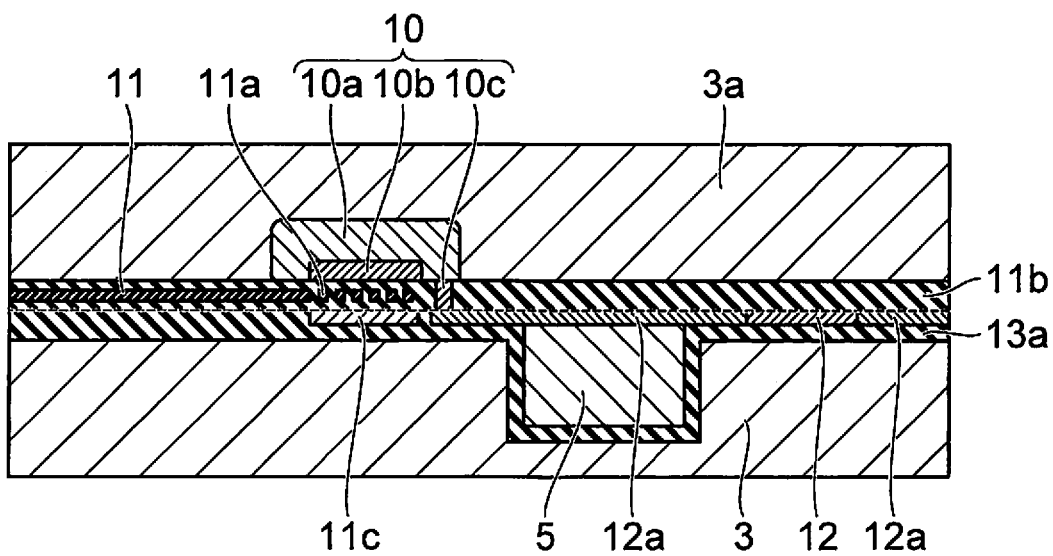
FIG. 12 is a schematic cross-sectional view of the charged particle beam deflection device of the fourth embodiment.
Figure 13:
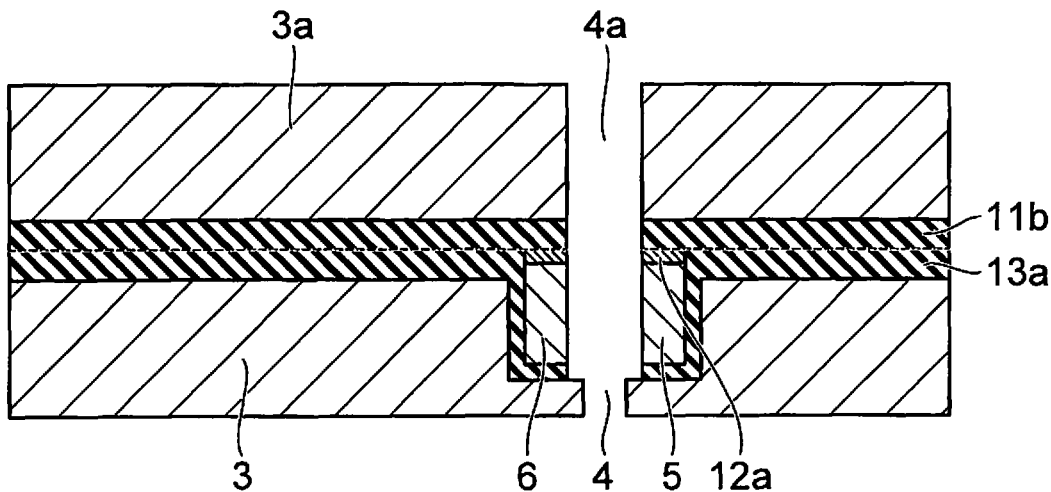
FIG. 13 is a schematic cross-sectional view of the charged particle beam deflection device of the fourth embodiment.

FIG. 11 to FIG. 13 are schematic configuration cross-sectional views showing a fourth embodiment, and are an example in which the substrate 3 in which the electrical components are integrated and the substrate 3a in which the optical components and the light receiving element 10 are integrated are bonded to oppose each other. For the description, FIG. 11 shows a state directly before bonding the substrate 3 and the substrate 3a; and FIG. 12 and FIG. 13 are the finished state after bonding the two. FIG. 12 is a schematic cross-sectional view corresponding to A-A' of FIG. 2; and FIG. 13 is a schematic cross-sectional view corresponding to B-B' of FIG. 2.

In the embodiment, the optical coupling fluctuation of the optical waveguide 11 and the light receiving element 10 that can occur in the third embodiment can be suppressed. According to the configuration of FIG. 12, the optical coupling portion (the diffraction grating 11a) of the optical waveguide 11 is formed as one body with the light receiving element 10; there is substantially no positional misalignment between the diffraction grating 11a and the light receiving element; the optical coupling does not go through the substrate bonding interface; therefore, light scattering loss due to a micro void occurring due to peeling of the substrate bonding interface or trapped dirt does not occur. Also, in the third embodiment described above, it is necessary to bury the reflective metal 11c in the $SiO_2$ 11b interior; but in the embodiment, it is sufficient to form the reflective metal 11c on the surface of the substrate 3; and this portion is not a problem even when a micro void exists at the bonding interface. Accordingly, it is unnecessary for the reflective metal 11c to withstand the formation temperature of the cladding layer $SiO_2$ 11b as in the third embodiment; and there is no limit on the material selection of the reflective metal 11c.

In the fourth embodiment, the substrate 3 and the substrate 3a are electrically connected to each other; and in FIG. 12, the prescribed circuit is configured by electrically connecting the p-electrode 10c and a not-illustrated n-electrode to the electrical interconnect 12a. In such a case, connection defects can be suppressed by providing an electrical pad having a surface area in which a positional misalignment margin is added to the connection surface area of the electrical interconnect 12a or the electrodes recited above to absorb the positional misalignment at the connection portions between the electrodes and the interconnect 12a.

Similarly to the third embodiment, the substrate 3a functions as a scattered electron cover for the components of the light receiving element 10, the load resistance 12, etc.; therefore, the degradation of the BAA 8 is suppressed; and the running cost reduction effect is high due to the reliability of the device and the enlargement of the maintenance interval.

Fifth Embodiment

Figure 14:
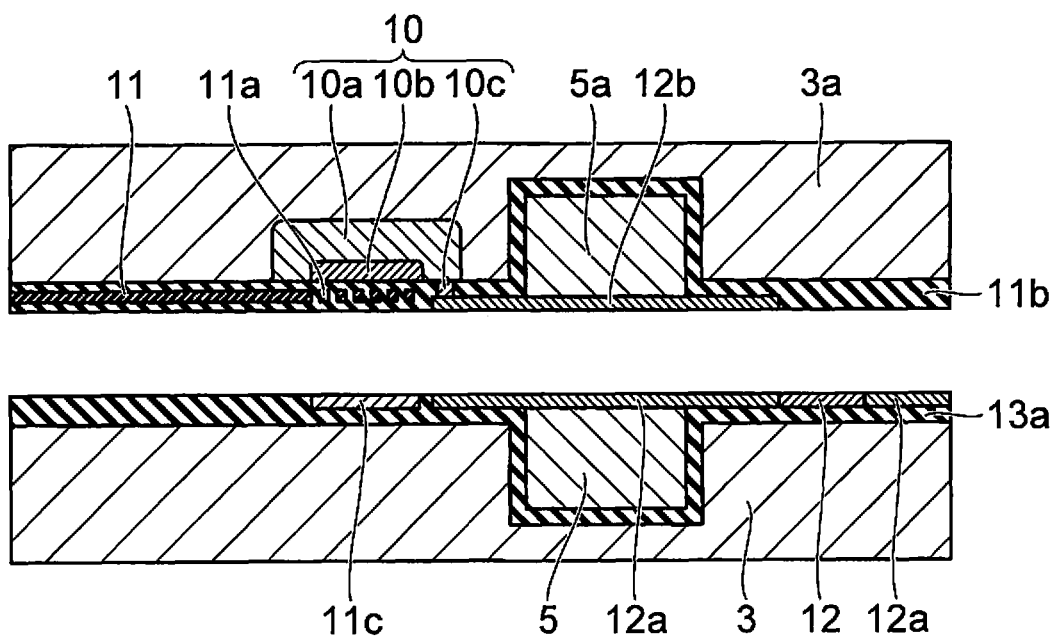
FIG. 14 is a schematic cross-sectional view of a charged particle beam deflection device of a fifth embodiment.
Figure 15:
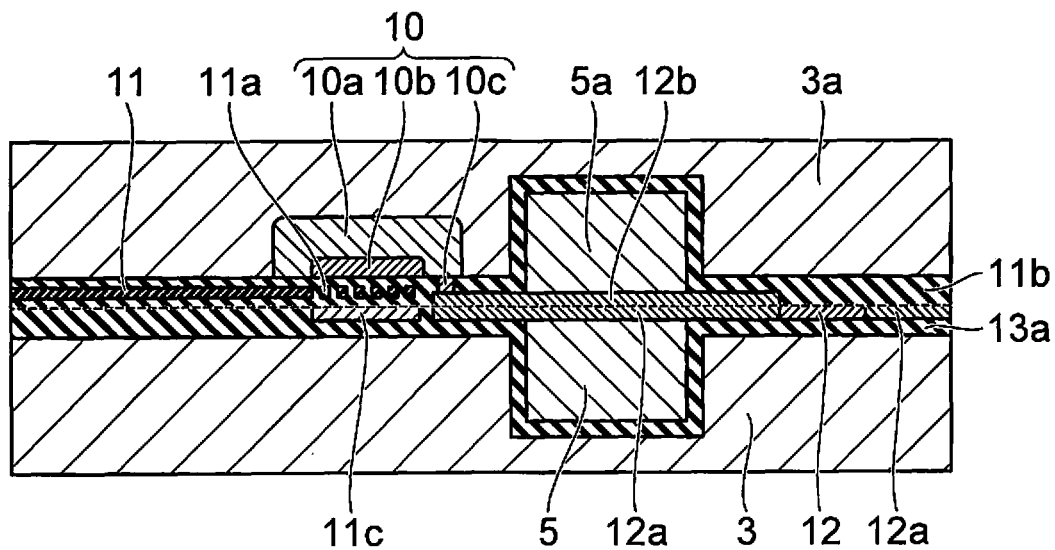
FIG. 15 is a schematic cross-sectional view of the charged particle beam deflection device of the fifth embodiment.
Figure 16:
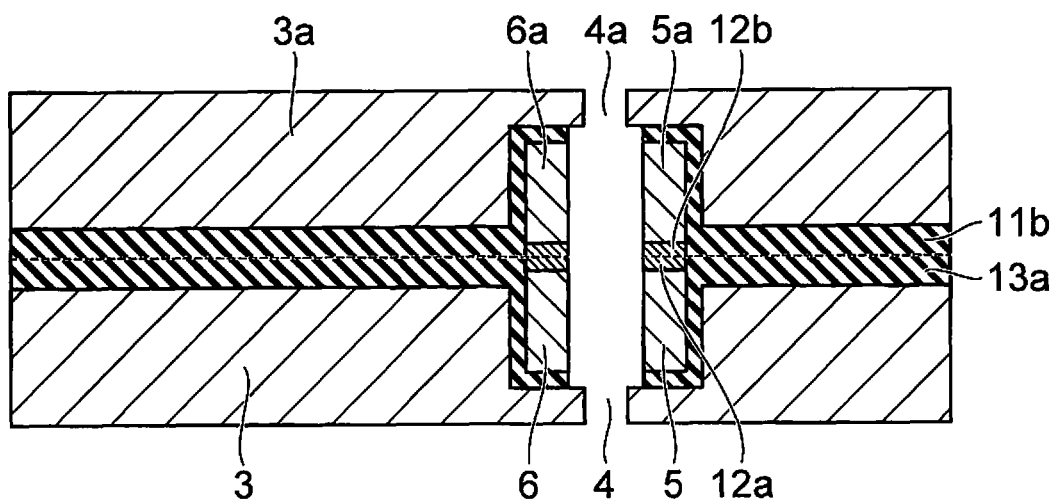
FIG. 16 is a schematic cross-sectional view of the charged particle beam deflection device of the fifth embodiment.

FIG. 14 to FIG. 16 are schematic configuration cross-sectional views showing a fifth embodiment in which a deflection electrode 5a and a counter electrode 6a also are provided in the substrate 3a in which the optical components and the light receiving element 10 are integrated. For the description, FIG. 14 shows a state directly before bonding the substrate 3 and the substrate 3a; and FIG. 15 and FIG. 16 are the finished state after bonding the two. FIG. 15 is a schematic cross-sectional view corresponding to A-A' of FIG. 2; and FIG. 16 is a schematic cross-sectional view corresponding to B-B' of FIG. 2.

The embodiment has a configuration in which the deflection electrode 5 and the counter electrode 6 are extended, which is equivalent to extending the length of the electric field application region for the passing electron beam. Therefore, in the embodiment, advantages are provided in that the deflection angle is larger for the same applied voltage; and the applied voltage can be reduced for the same deflection angle. For example, in the case where the deflection electrodes 5 and 5a and the counter electrodes 6 and 6a have the same lengths and the deflection electrode drive voltage of the fourth embodiment is taken to be +5 V, the drive voltage of the deflection electrode of the embodiment is halved to +2.5 V. This is equivalent to halving the power consumption of the BAA 8; and effects such as a life extension of the BAA 8, etc., are obtained. Also, similarly to the third embodiment and the fourth embodiment, the substrate 3a functions as a scattered electron cover for the components of the light receiving element 10, the load resistance 12, etc.; therefore, the degradation of the BAA 8 is suppressed; and the running cost reduction effect is high due to the reliability of the device and the enlargement of the maintenance interval.

Sixth Embodiment

Although embodiments of the BAA 8 and the blanker 7 are shown in the embodiments recited above, embodiments that include the supply configuration of the control light 14 will now be described.

Figure 17:
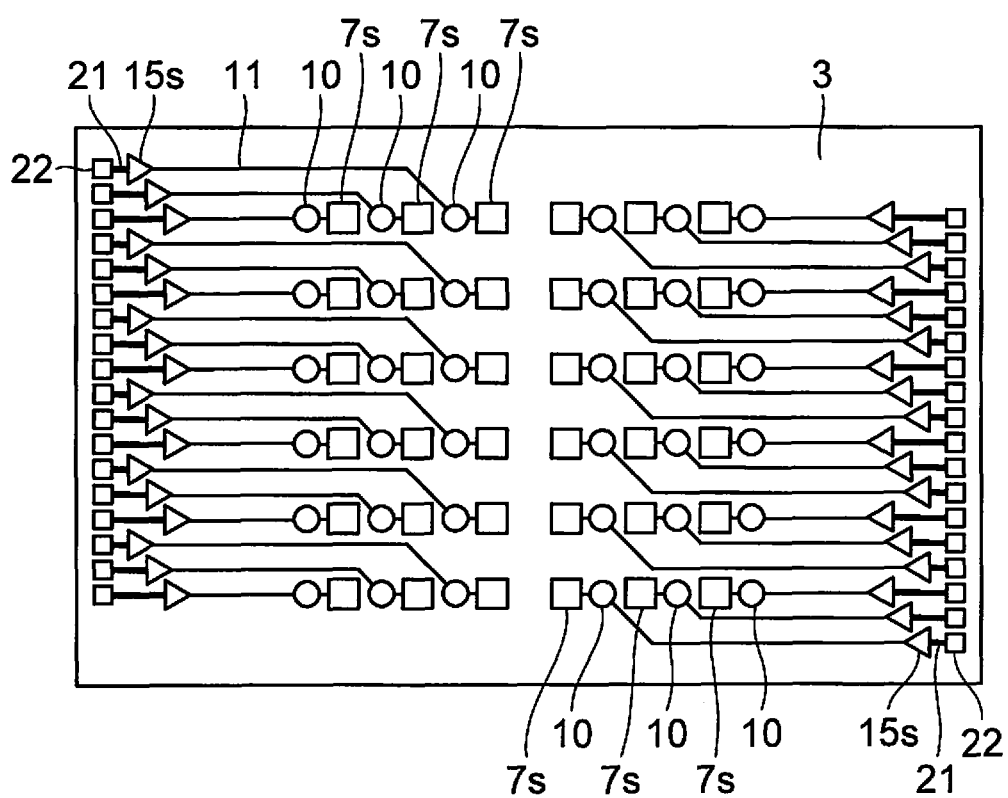
FIG. 17 is a schematic top view of a charged particle beam deflection device of a sixth embodiment.
Figure 18A:
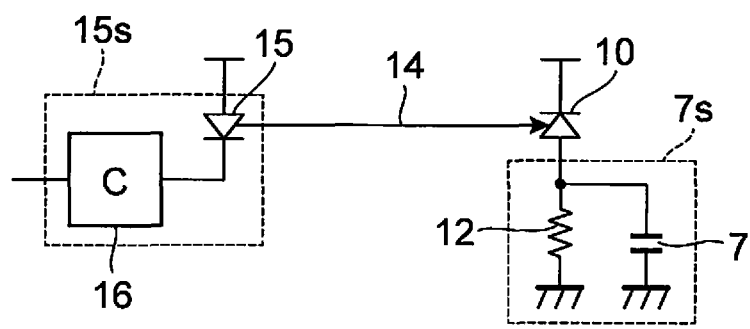
FIGS. 18A and 18B are equivalent circuit diagrams of the charged particle beam deflection device of the sixth embodiment.
Figure 18B:
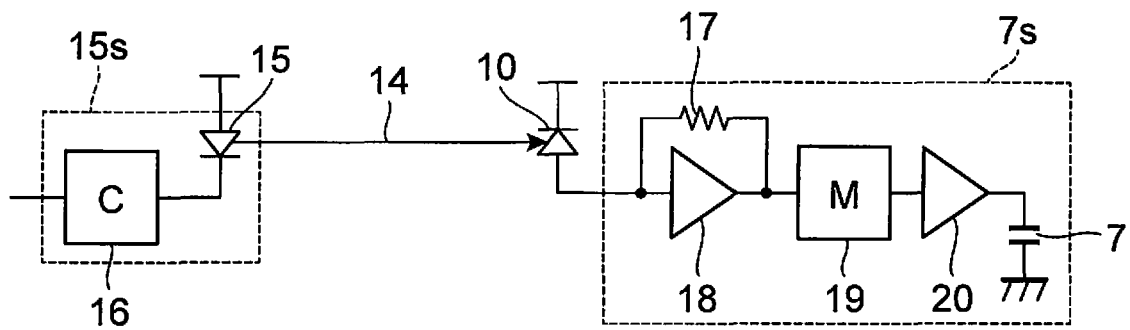

FIG. 17 to FIG. 18B are schematic top views showing the sixth embodiment; and here, an example of a 6×6 two-dimensionally arranged BAA is shown as an example.

FIG. 17 illustrates the Si substrate 3, the blanker and receiving circuit 7s, the light receiving element 10, the optical waveguide 11, an optical transmitter (a light-emitting element and a transmitting circuit) 15s, electrical interconnect 21, and an electrical terminal (an input pad) 22; and these components are included in, for example, the circuit shown in FIG. 18A or FIG. 18B. The blanker 7s and the light receiving element 10 are arranged as a set in a two-dimensional array. The light receiving elements 10 are arranged in the blanker array region where the multiple blankers 7s are arranged. The distance between the light receiving element 10 and the blanker 7s is shorter than the distance between mutually-adjacent blankers 7s. The multiple light receiving elements 10 arranged in the array include the light receiving elements 10 arranged between the multiple blankers 7s. The optical waveguide 11 is formed to be directly proximal to the blanker 7s. The optical waveguides 11 are formed also in the regions between the multiple blankers 7s.

FIG. 18A and FIG. 18B illustrate a light-emitting element (a light-emitting diode, a semiconductor laser, or the like) 15, a drive circuit (a transmitting circuit) 16 of the light-emitting element 15, and a conversion resistor 17 of the transimpedance circuit; and here, similarly to FIGS. 4A to 4C, the optical waveguide 11 is not illustrated; and a simplified light input/output relationship is shown by the arrow of the control light 14. Instead of the conversion resistor 17, the transimpedance circuit of FIG. 18B may be a high-impedance circuit using the load resistance 12 as in FIG. 4B.

The blankers 7s are connected respectively to the light receiving elements 10; and when the blanking control signal is input to the terminal 22, the optical transmitter 15s that corresponds to the input pad generates the control light 14 and inputs the control light 14 to the light receiving element 10 via the optical waveguide 11. Thereby, the blanking operation of the BAA is possible using a mechanism similar to that of the first embodiment shown in FIGS. 4A to 4C. As a result, in the BAA interior, the interference of the blanking control signal and the electromagnetic disturbance superimposed onto the electron beam can be suppressed by the optical interconnect; and from the outside, the operation is possible by an electrical signal input; therefore, device performance improvement can be realized while inheriting the device know-how of electrical interconnect that has been accumulated in the past.

The embodiment of FIG. 17 individually and directly controls the blankers from outside the BAA; and one input pad 22 corresponds uniquely to one optical waveguide 11 and one blanker 7. Therefore, the number of optical waveguides undesirably increases as the number of blankers built into the BAA (the number of multi-electron beams) increases; and it also may be considered that the interconnect space may become insufficient. In such a case, similarly to FIG. 4C, the circuit configuration of FIG. 18B is applicable; and the control may be performed by performing high-speed writing to the memory circuit 19 and by transferring the stored data of multiple blankers to multiple blankers.

Figure 19:
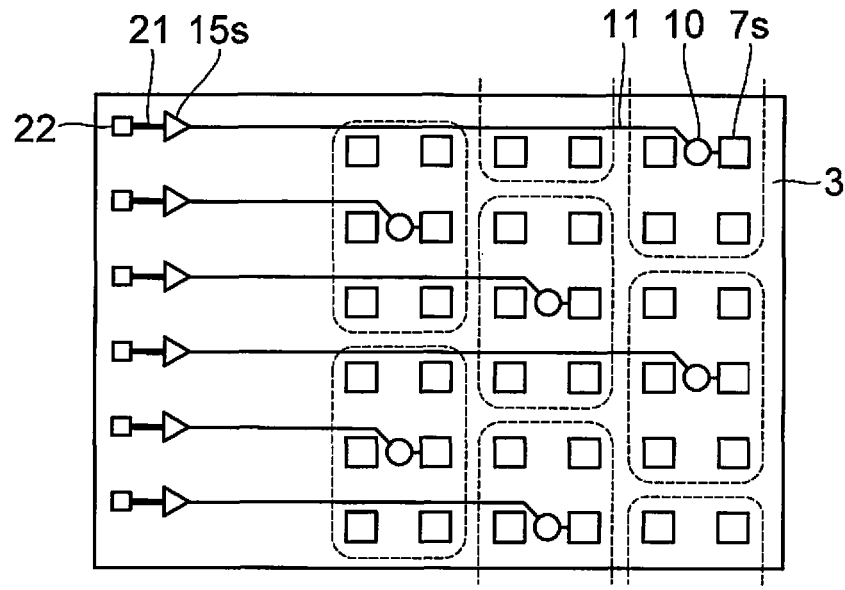
FIG. 19 is a schematic top view of a modification of the charged particle beam deflection device of the sixth embodiment.

For example, as shown in FIG. 19, by controlling six blankers 7s by one optical waveguide 11, the number of optical waveguides can be reduced to ⅙ of the case of direct individual driving. The broken line area of FIG. 19 shows the area of a blanker group controlled by one optical waveguide 11 and one light receiving element 10; and the state is shown in which a portion of a 6×6 or larger two-dimensional arrangement is extracted. The multiple blankers 7s that belong to the blanker group corresponding to one optical waveguide 11 and one light receiving element 10 are controlled. It is apparent from the comparison of FIG. 19 and FIG. 17 that the congestion of the blanking control signal interconnect can be relaxed drastically by the multiple blanker control and the high-speed data transfer using the memory circuit. The number of controlled blankers is not limited to 6; and the interconnect can be configured easily by using a symmetric arrangement number such as, for example, 2, 4, 6, 8, 9, 12, 16, etc.

Seventh Embodiment

Figure 20:
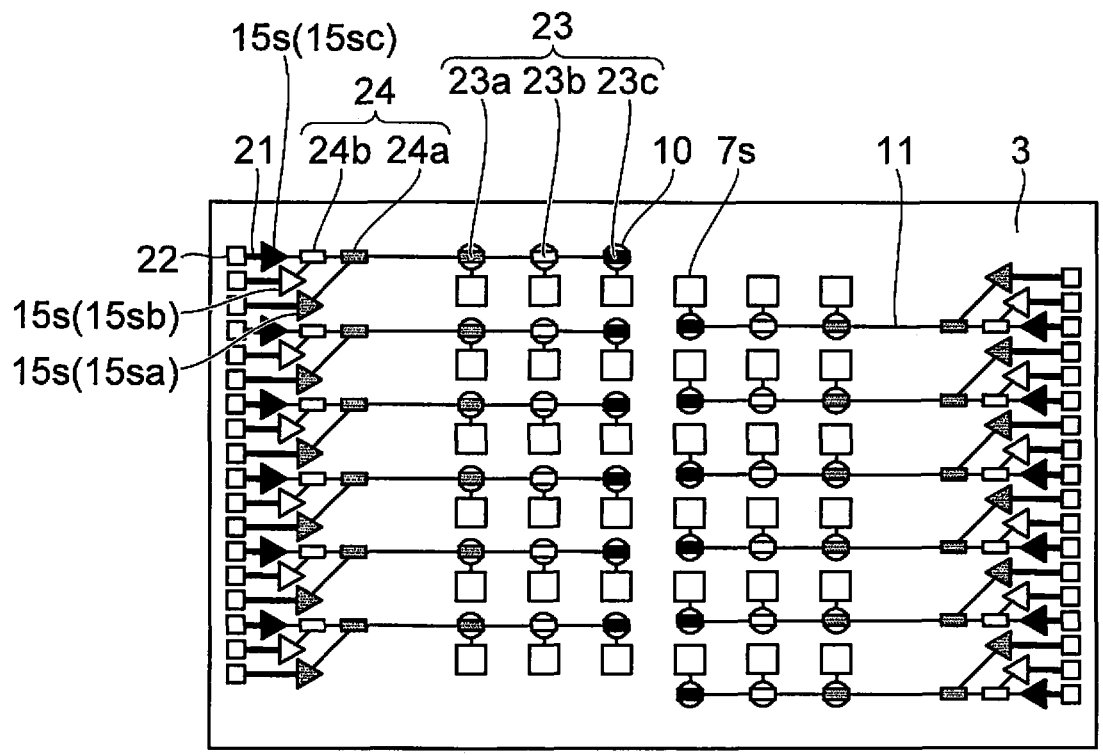
FIG. 20 is a schematic top view of a charged particle beam deflection device of a seventh embodiment.
Figure 21:
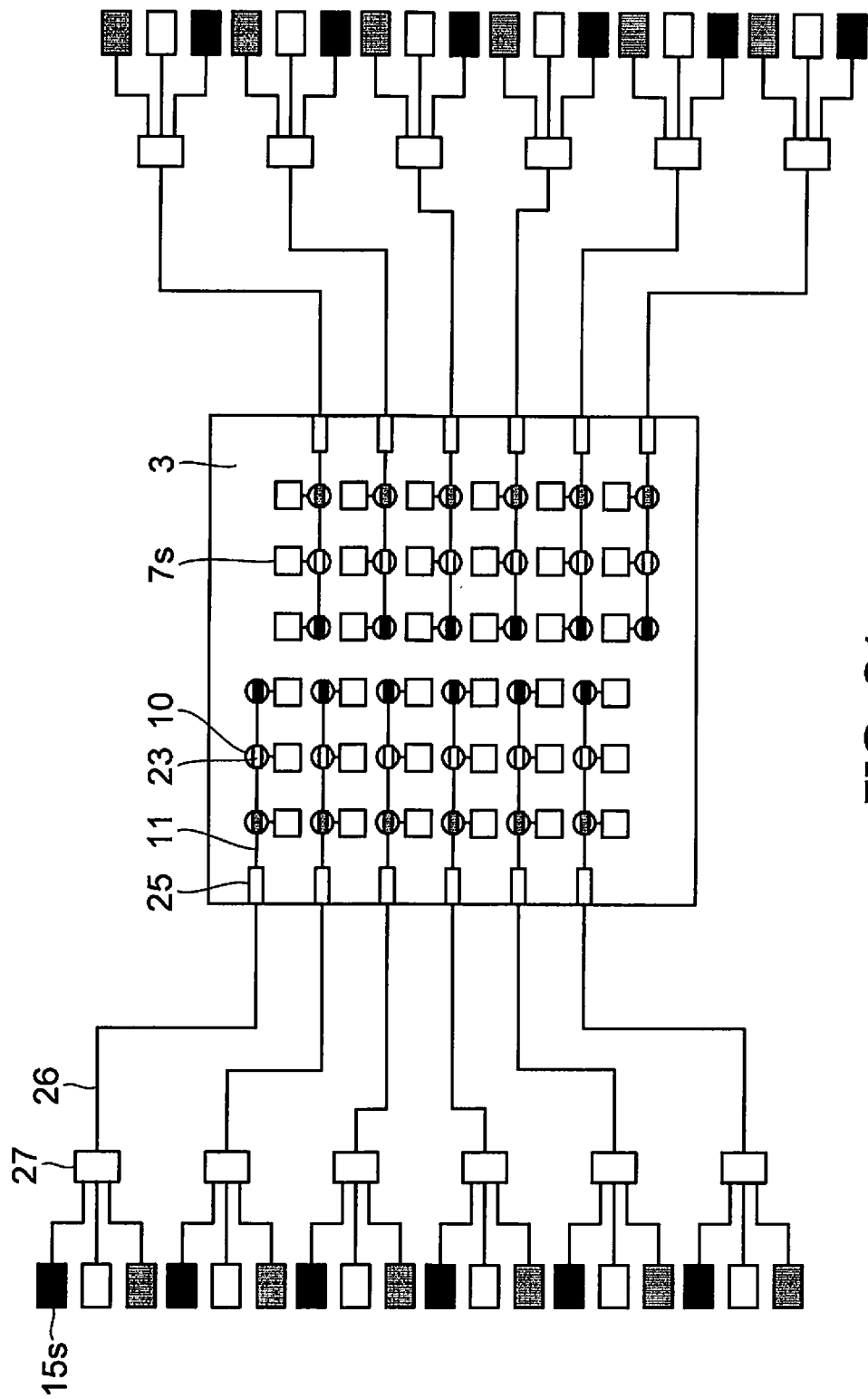
FIG. 21 is a schematic top view of a charged particle beam deflection device of an eighth embodiment.
Figure 26:
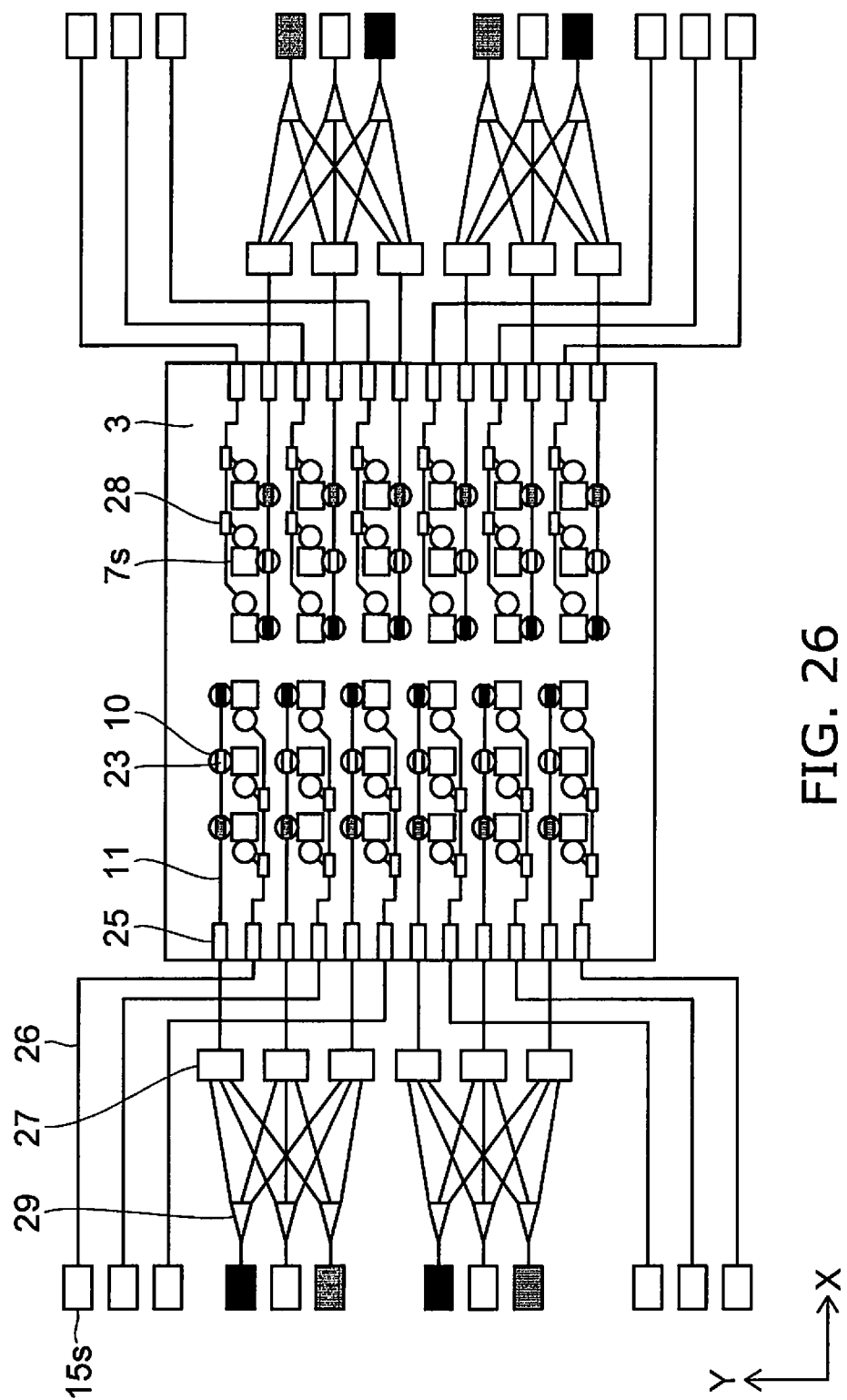
FIG. 26 is a schematic top view of a charged particle beam deflection device of the tenth embodiment.

FIG. 20 is a schematic top view showing a seventh embodiment, and shows an example in which a 6×6 two-dimensionally arranged BAA is used as an example; and so-called wavelength division multiplexing (referred to as WDM below) optical interconnect multiply transmits light of different wavelengths using one optical waveguide 11. Here, although an example is shown in which three wavelengths of multiplexed light are used per optical waveguide, it goes without saying that this is not limited thereto. In FIG. 20, FIG. 21, and FIG. 26, the components illustrated by solid black, solid white, and dot patterns handle different wavelengths.

FIG. 20 illustrates splitters (wavelength selective couplers) 23 (23a, 23b and 23c) and multiplexers (wavelength selective couplers) 24 (24a and 24b); and here, the light emission wavelength of an optical transmitter 15sa is taken as λa; the light emission wavelength of an optical transmitter 15sb is taken as λb; and the light emission wavelength of an optical transmitter 15sc is taken as λc. These light waves are multiplexed in one optical waveguide 11 by the multiplexers 24a and 24b. This is similar for the other optical waveguides 11 as well.

The multiplexer 24a has wavelength selectivity for λa; and, for example, it is sufficient to use a wavelength selective coupler having sensitivity to λa such as a directional optical coupler in which the optical coupling length corresponds to λa, a grating coupler having a period corresponding to λa, etc. The multiplexer 24a has a configuration that simply transmits the wavelengths other than λa. The multiplexer 24b includes a wavelength selective coupler having selectivity to λb and has a configuration that couples λb to the optical waveguide 11 and simply transmits the wavelengths other than λb. λc may simply be optically coupled to the optical waveguide 11.

The splitter 23a is configured to have the reverse operation of the multiplexer 24a. In other words, the configuration simply transmits the wavelengths other than λa; and the configuration outputs the light of the wavelength of λa in the light receiving element 10 direction. Similarly, the splitter 23b is configured to output light of only the wavelength of λb in the light receiving element 10 direction. The splitter 23c may be configured to output light of only the wavelength of λc in the light receiving element 10 direction, or may be configured to output all of the light in the light receiving element 10 direction by a 45° mirror, etc.

By such a configuration, even though there is one physical optical waveguide, there are three effective channels of the optical interconnect; and it is possible to drastically relax the congestion of the blanking control signal interconnect. Of course, the number of multiplexed wavelengths of the WDM is arbitrary; and it is sufficient for the wavelength spacing and the number of multiplexed wavelengths to be determined considering the wavelength shift amount due to the change of the environment temperature, the crosstalk amount between adjacent wavelength channels, etc. The combination of the wavelength of the WDM optical interconnect and the arrangement of the light emission and the light receiving elements can be set arbitrarily.

Eighth Embodiment

FIG. 21 is a schematic top view showing an eighth embodiment, and is an example in which the optical transmitters 15s of the seventh embodiment are provided outside the BAA substrate.

FIG. 21 illustrates an optical coupler 25, an optical fiber 26, and an optical fiber multiplexer 27; and the optical coupler 25 is a so-called spot size converter that matches the propagating light of the optical waveguide 11 which has a small spot size to the optical waveguide mode of the optical fiber 26 which has a relatively large spot size. The optical fiber multiplexer 27 is a WDM coupler that couples multiple wavelength channels into one optical fiber by using optical fiber directional couplers, wavelength filters, etc.; and the function of the optical fiber multiplexer 27 is similar to that of the multiplexer 24 shown in the seventh embodiment.

By such a configuration, there are three effective channels of the optical interconnect even though there is one physical optical waveguide; and it is possible to drastically relax the congestion of the blanking control signal interconnect. By coupling the optical transmitters 15s in the optical fiber 26 and by providing the optical transmitters 15s outside the BAA substrate, a remote arrangement of the optical transmitting portions is possible; and it is possible to use relatively large optical modules. Thereby, a high-precision wavelength control optical transmitter can be used for which the temperature control is performed precisely by a built-in Peltier device; the wavelength spacing of the WDM can be narrow so that the number of multiplexed wavelengths can be increased to, for example, 20 or more, etc.; and it is possible to drastically increase the effective channel number per optical waveguide. Also, by providing the optical transmitters outside the BAA, the BAA is not heated by the heat generation of the optical transmitters; and higher operational stability and a longer life of the BAA are possible.

Ninth Embodiment

Figure 22:
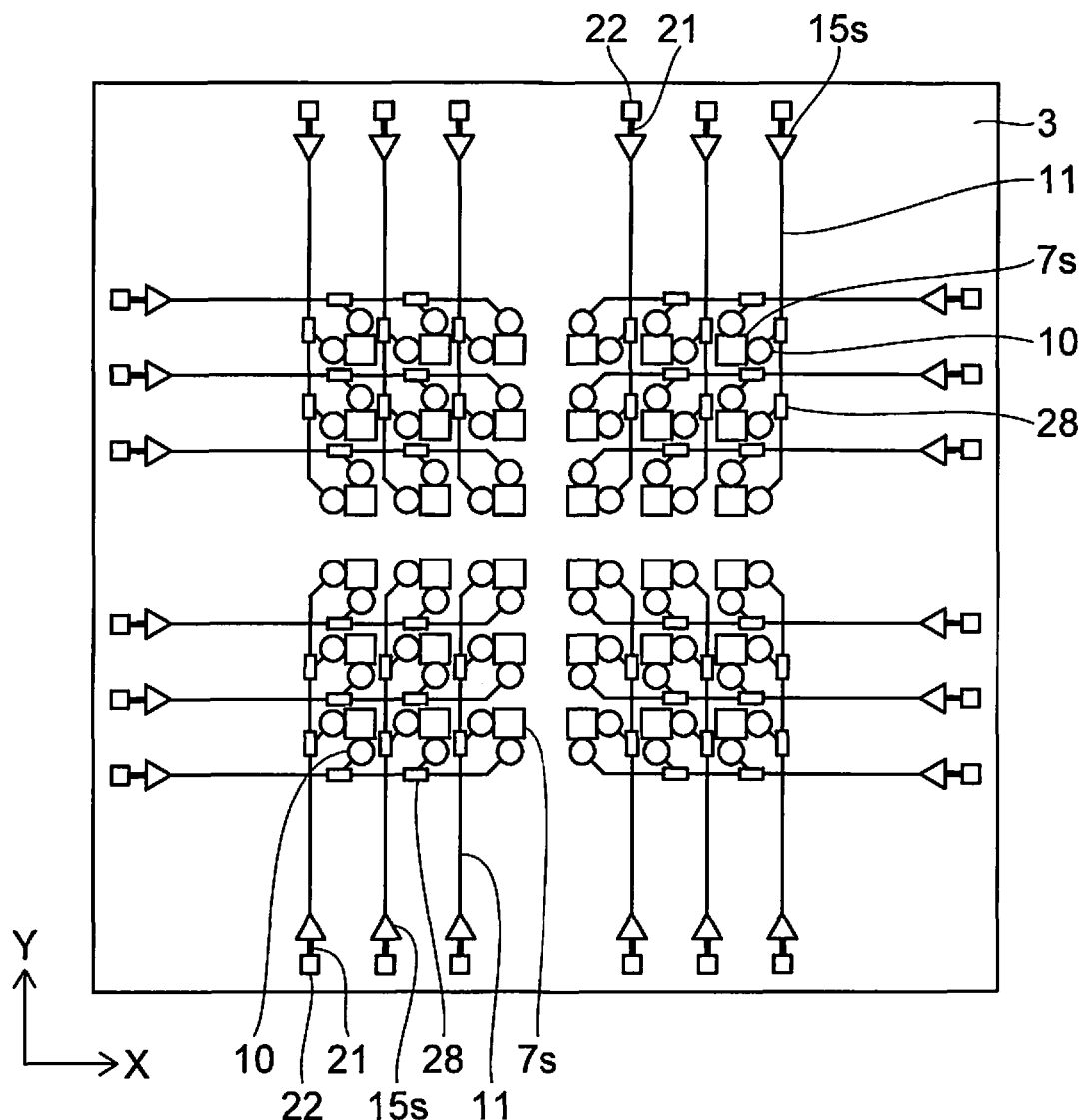
FIG. 22 is a schematic top view of a charged particle beam deflection device of a ninth embodiment.

FIG. 22 is a schematic top view showing a ninth embodiment, and is an example in which the blankers are operated by being selected by optical interconnect having a matrix configuration. Here, the blankers include two light receiving elements 10; the light receiving elements 10 in the horizontal direction of the page surface (taken as an X-direction) are connected to a common optical waveguide; and the light receiving elements 10 in the vertical direction (taken as a Y-direction) are connected to a common optical waveguide.

In FIG. 22, light distributors 28 are provided; and the coupling efficiency is adjusted so that the light is distributed uniformly to all of the connected light receiving elements 10. Although the light distribution to the light receiving elements 10 is performed sequentially from the optical waveguide 11 in the configuration of FIG. 22, the light may be supplied to the light receiving elements 10 by light distribution using a multimode interference device or a two-branch optical waveguide having a cascade connection.

Figure 23:
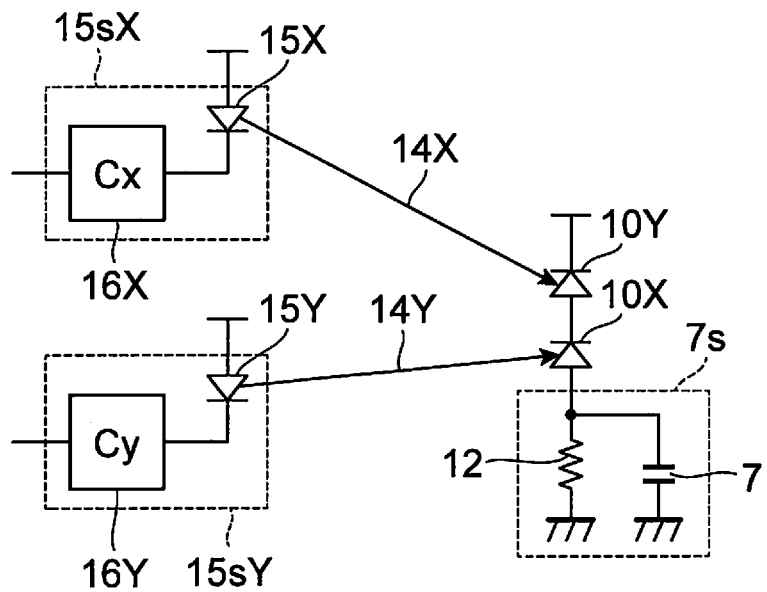
FIG. 23 is an equivalent circuit diagram of the charged particle beam deflection device of the ninth embodiment.

For example, the optical receiving circuit of the embodiment provides the input to the receiving circuit 7s by light receiving elements 10X and 10Y that has a cascade connection as shown in FIG. 23. Thereby, when an optical transmitter 15sX or an optical transmitter 15sY of FIG. 23 are independently operated, a photocurrent does not flow in the receiving circuit 7s; and the state is an unselected state, i.e., a non-operating state. Conversely, the only operating state of the receiving circuit 7s is when both the optical transmitter 15sX and the optical transmitter 15sY operate.

Accordingly, the receiving circuits 7s shown in FIG. 22 only receive light when positioned at the intersections of the X-direction optical waveguide in the operating state and the Y-direction optical waveguide in the operating state; and it is possible to selectively operate the blanker of the corresponding intersection by the selection of the X-direction optical waveguide and the selection of the Y-direction optical waveguide. In other words, matrix driving of the blankers is possible; and it is possible to sequentially scan all of the blankers by the sequential selection in the X-direction and the sequential selection in the Y-direction.

However, in the configuration of FIG. 23, basically only one row (or one column) in the X-direction or the Y-direction of the blankers is operable simultaneously; all of the blankers cannot be independently operated simultaneously; and the maximum capacity of the two-dimensionally arranged BAA cannot be realized.

Figure 24:
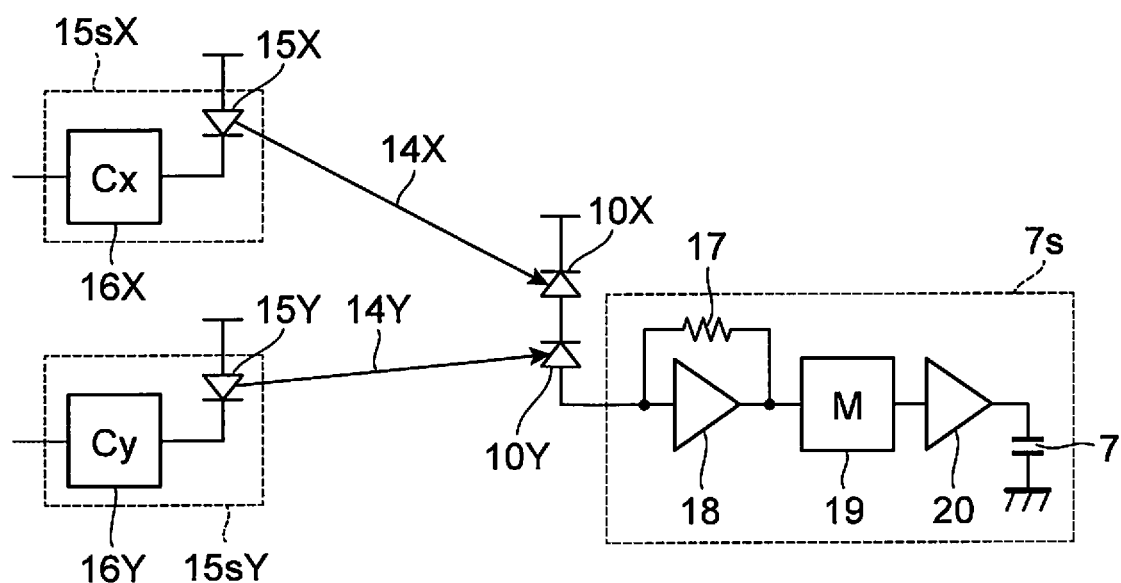
FIG. 24 is an equivalent circuit diagram of the charged particle beam deflection device of the ninth embodiment.

Therefore, by row scanning (or column scanning) or sequentially scanning the blankers using the configuration of FIG. 24, data storage in the memory circuit 19 of each of the blankers is performed; and all of the blankers may be operated simultaneously after the data storage to all of the memory circuits have finished. In such a case, as described in the embodiment of FIG. 18B, it is possible to drastically relax the congestion of the blanking control signal interconnect by controlling multiple blankers by one memory circuit.

Figure 25:
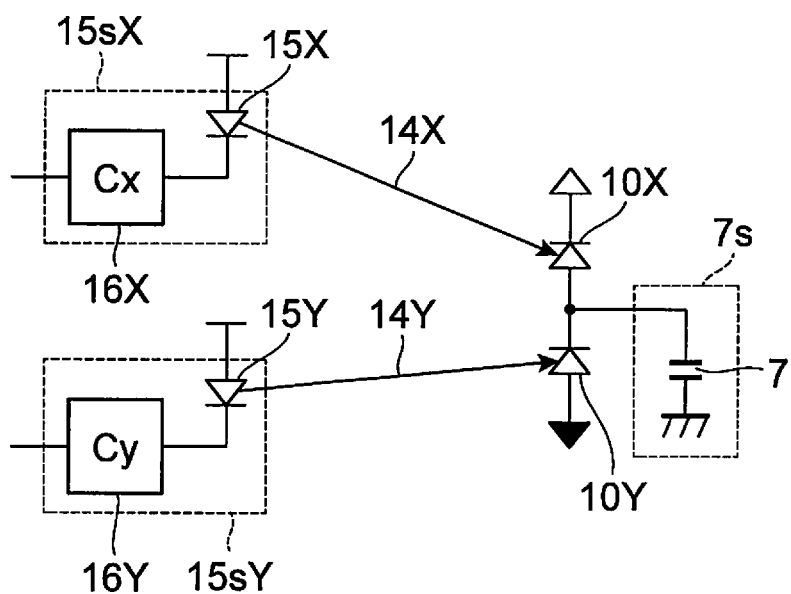
FIG. 25 is an equivalent circuit diagram of the charged particle beam deflection device of the ninth embodiment.

In the case of the embodiment, it is possible for the blanker operation to be bipolar by using the configuration shown in FIG. 25. In FIG. 25, the white triangles illustrate positive power supplies; and the black triangles illustrate negative power supplies. Here, bipolar operation refers to the operation of switching between a positive electric field and a negative electric field, i.e., reverse polarity electric fields; and it is possible for the electron beam passing through the BAA to have not only the operations of traveling straight and deflecting but also a three-state operation of deflecting, reverse-deflecting, and traveling straight.

Although the optical transmitters 15s that are used in FIG. 22 are mounted to the BAA substrate, the optical transmitters that are provided outside the BAA substrate as in FIG. 21 may be used.

Tenth Embodiment

FIG. 26 is a schematic top view showing a tenth embodiment, and is an example in which the blankers are operated by being selected by optical interconnect having a matrix configuration. Here, each of the blankers includes two light receiving elements 10; each of one of the two light receiving elements in the page surface horizontal direction (taken as the X-direction) are connected to a common optical waveguide; and each of the other of the two light receiving elements are connected to an optical waveguide of WDM optical interconnect.

In the configuration of FIG. 26, an optical fiber distributor 29 is provided; here, the light of one wavelength is uniformly distributed to three optical fibers. For the light distribution in the X-direction of FIG. 26, the light may be supplied to the light receiving elements 10 by light distribution using a multimode interference device or a two-branch optical waveguide having a cascade connection. The light receiving elements that are connected to the WDM optical interconnect have the same wavelength selectivity in the Y-direction; and in the page surface vertical direction, the column selection is performed using the wavelength.

In the embodiment, the matrix driving of the two-dimensionally arranged blankers is possible by the selection (the row selection) of the X-direction optical waveguide and by the wavelength selection (the column selection) used instead of the Y-direction selection. In other words, in the embodiment of FIG. 26, even though there is no physical Y-direction optical waveguide, a function that is equivalent to the selection of the Y-direction optical waveguide is provided by selecting the wavelength. Thereby, it is unnecessary to arrange optical transmitters in both the X-direction and the Y-direction; and it is possible to simplify the configuration by collecting the signal inputs in the two directions of left and right in the BAA substrate.

It is not always necessary for the wavelength selection used instead of the Y-direction selection recited above to be a column selection (the same wavelength in the Y-direction); and the arrangement may be according to a routing table including the positional relationship for the wavelengths. Further, although an example is shown in FIG. 26 in which the selection (the row selection) of the X-direction optical waveguide and the wavelength selection used instead of the Y-direction selection are used, position selection that uses wavelengths may be used for both the X-direction and the Y-direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A charged particle beam deflection device, comprising:
a substrate;
a plurality of charged particle beam transmission apertures provided in the substrate;
a plurality of electrode pairs deflecting charged particle beams passing through the charged particle beam transmission apertures;
a light receiving element controlling a voltage applied to one electrode of the electrode pair, a distance between one of the charged particle beam transmission apertures and the light receiving element being shorter than a distance between mutually-adjacent charged particle beam transmission apertures;
an optical waveguide providing an optical signal to the light receiving element; and
a load resistance connected to the light receiving element, a connection interconnect of the light receiving element and the load resistance being connected to the one electrode of the electrode pair.

2. The device according to claim 1, wherein the electrode pair is stacked on the substrate.

3. The device according to claim 1, wherein the electrode pair is buried in the substrate.

4. The device according to claim 3, further comprising a second substrate having a plurality of charged particle beam transmission apertures,
the substrate and the second substrate being bonded with the charged particle beam transmission apertures of the substrate and the charged particle beam transmission apertures of the second substrate positionally aligned.

5. The device according to claim 4, further comprising a second electrode pair buried in the second substrate.

6. The device according to claim 1, wherein one optical waveguide and one light receiving element control a voltage applied to a plurality of the one electrode.

7. The device according to claim 1, further comprising a light-emitting element or an optical coupler introducing an optical signal to the optical waveguide.

8. The device according to claim 7, wherein
a prescribed number of charged particle beam transmission apertures of the plurality of charged particle beam transmission apertures is set as one group, and
the light receiving elements inside the group are operated independently by one optical waveguide by setting the light receiving elements inside the group to selectively receive light of mutually-different wavelengths.

9. A charged particle beam deflection device, comprising:
a substrate;
a plurality of charged particle beam transmission apertures provided in the substrate;
a plurality of electrode pairs deflecting charged particle beams passing through the charged particle beam transmission apertures;
a light receiving element controlling a voltage applied to one electrode of the electrode pair, a distance between one of the charged particle beam transmission apertures and the light receiving element being shorter than a distance between mutually-adjacent charged particle beam transmission apertures;
an optical waveguide providing an optical signal to the light receiving element;
a load resistance or a transimpedance amplifier connected to the light receiving element;
a memory circuit storing a digital voltage signal of the load resistance or the transimpedance amplifier; and
a drive circuit applying a voltage to the one electrode of the electrode pair according to data of the memory circuit.

10. The device according to claim 9, wherein the electrode pair is stacked on the substrate.

11. The device according to claim 9, wherein the electrode pair is buried in the substrate.

12. The device according to claim 11, further comprising a second substrate having a plurality of charged particle beam transmission apertures,
the substrate and the second substrate being bonded with the charged particle beam transmission apertures of the substrate and the charged particle beam transmission apertures of the second substrate positionally aligned.

13. The device according to claim 12, further comprising a second electrode pair buried in the second substrate.

14. The device according to claim 9, wherein one optical waveguide and one light receiving element control a voltage applied to a plurality of the one electrode.

15. The device according to claim 9, further comprising a light-emitting element or an optical coupler introducing an optical signal to the optical waveguide.

16. The device according to claim 15, wherein
a prescribed number of charged particle beam transmission apertures of the plurality of charged particle beam transmission apertures is set as one group, and
the light receiving elements inside the group are operated independently by one optical waveguide by setting the light receiving elements inside the group to selectively receive light of mutually-different wavelengths.

17. A charged particle beam deflection device, comprising:
a substrate;
a plurality of charged particle beam transmission apertures two-dimensionally arranged in the substrate;
an electrode pair deflecting a charged particle beam passing through one of the charged particle beam transmission apertures;
two light receiving elements connected in series;
two optical waveguides independently providing optical signals respectively to the two light receiving elements;
two light-emitting elements or two optical couplers independently introducing the optical signals respectively to the two optical waveguides; and a load resistance or a transimpedance amplifier connected to the two light receiving elements and applying a voltage to one electrode of the electrode pair.

18. The device according to claim 17, wherein a prescribed number of charged particle beam transmission apertures of the two-dimensionally arranged plurality of charged particle beam transmission apertures is set as one group, one of the two light receiving elements corresponding to each charged particle beam transmission aperture inside the group is optically coupled to a first optical waveguide, and the light receiving elements optically coupled to the first optical waveguide are set to selectively receive light of mutually-different wavelengths to cause the light receiving elements inside the group optically coupled to the first optical waveguide to be operated independently.

19. The device according to claim 18, wherein the light receiving elements inside the group not coupled to the first optical waveguide are optically coupled to a second optical waveguide and operated simultaneously.

20. The device according to claim 17, further comprising a memory circuit storing a digital voltage signal of the load resistance or the transimpedance amplifier, and a drive circuit applying a voltage to the one electrode of the electrode pair according to data of the memory circuit.

21. A charged particle beam deflection device, comprising:

a substrate;

one or a plurality of charged particle beam transmission apertures provided in the substrate;

an electrode pair deflecting a charged particle beam passing through the charged particle beam transmission aperture;

two light receiving elements;

two optical waveguides independently providing optical signals respectively to the two light receiving elements; and two light-emitting elements or two optical couplers independently introducing the optical signals respectively to the two optical waveguides, a cathode of a first light receiving element of the two light receiving elements being set to a high potential, an anode of a second light receiving element of the two light receiving elements being set to a low potential, an anode of the first light receiving element being connected to a cathode of the second light receiving element and one electrode of the electrode pair.

\* \* \* \* \*